(12) United States Patent
Kim et al.

(10) Patent No.: US 8,536,045 B2
(45) Date of Patent: *Sep. 17, 2013

(54) REFLOW METHOD

(71) Applicant: Samsung Electronics Co., Ltd., Suwon-Si (KR)

(72) Inventors: Minill Kim, Gyeonggi-do (KR); Kwang Yong Lee, Gyeonggi-do (KR); Jonggi Lee, Gyeonggi-do (KR); Ji-Seok Hong, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/656,290

(22) Filed: Oct. 19, 2012

(65) Prior Publication Data

US 2013/0068731 A1    Mar. 21, 2013

Related U.S. Application Data

(62) Division of application No. 12/591,821, filed on Dec. 2, 2009, now Pat. No. 8,324,522.

(30) Foreign Application Priority Data

Jan. 19, 2009 (KR) .......................... 10-2009-0004231

(51) Int. Cl.
  *H01L 21/44* (2006.01)
(52) U.S. Cl.
  USPC ........... 438/612; 219/85.1; 228/8; 228/179.1; 257/E21.508
(58) Field of Classification Search
  USPC ......... 219/85.1; 228/8, 179.1; 257/E21.508; 438/612
  See application file for complete search history.

(56) References Cited

U.S. PATENT DOCUMENTS 8,324,522 B2 * 12/2012 Kim et al. ................. 219/85.12
2007/0023486 A1 * 2/2007 Matsuura et al. .......... 228/179.1

FOREIGN PATENT DOCUMENTS

| JP | 2005-267863 | 9/2005 |
| JP | 2007-142343 | 6/2007 |
| KR | 10-0517010 | 9/2005 |
| KR | 10-2008-0043401 | 5/2008 |

* cited by examiner

*Primary Examiner* — Asok K Sarkar
(74) *Attorney, Agent, or Firm* — Harness, Dickey & Pierce P.L.C.

(57) ABSTRACT

A reflow method of a solder ball provided to a treatment object may include providing a coil, applying a current to the coil, and moving the treatment object through an internal space surrounded by the coil.

20 Claims, 28 Drawing Sheets

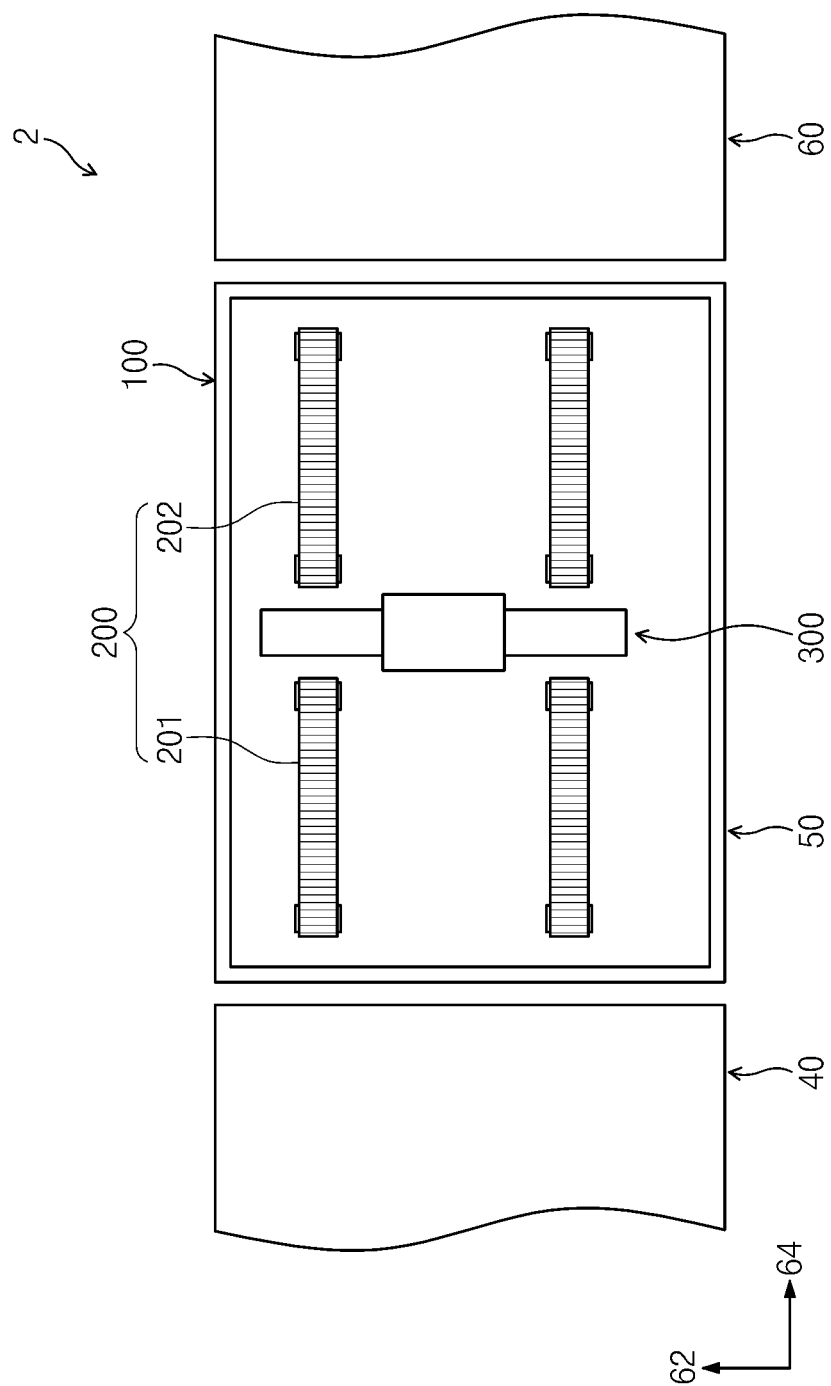

REFLOW METHOD

CROSS-REFERENCE TO RELATED APPLICATIONS

This application is a divisional application of U.S. patent application Ser. No. 12/591,821 (now U.S. Pat. No. 8,324,522 B2), entitled "REFLOW APPARATUS, REFLOW METHOD, AND PACKAGE APPARATUS" and filed on Dec. 2, 2009, and claims the associated benefit under 35 U.S.C. §121. Parent U.S. patent application Ser. No. 12/591, 821 claimed priority from Korean Patent Application No. 10-2009-0004231, filed on Jan. 19, 2009, in the Korean Intellectual Property Office (KIPO). The entire contents of parent U.S. patent application Ser. No. 12/591,821 and priority Korean Patent Application No. 10-2009-0004231 are incorporated herein by reference.

BACKGROUND OF INVENTIVE CONCEPTS

1. Field

Example embodiments of inventive concepts relate to apparatuses and methods for packaging a semiconductor chip, and more particularly, to apparatuses and methods for performing a reflow process of a solder ball provided on a semiconductor chip.

2. Description of the Related Art

A process of packaging a semiconductor chip may include a fabrication process that provides a solder ball to a semiconductor chip and a mounting process for mounting a semiconductor chip to which a solder ball is provided on a printed circuit board (PCB).

After performing the fabrication process and the mounting method respectively, a process of performing a reflow on a solder ball by heating the solder ball is required.

SUMMARY OF INVENTIVE CONCEPTS

Example embodiments of inventive concepts provide a reflow apparatus performing a reflow process of a solder ball provided to a treatment object. The reflow apparatus may include a power supply, a coil receiving a current from the power supply to heat the treatment object, a support member supporting the treatment object, the support member being disposed on the front or the rear of the coil, and a moving member relatively moving the treatment object or the coil so that the treatment object passes through an internal space surrounded by the coil.

In accordance with example embodiments of inventive concepts, a reflow apparatus for performing a reflow process of a solder ball provided to a treatment object may include a power supply, a coil configured to receive a current from the power supply to heat the treatment object, a support member configured to support the treatment object, the support member being on one of the front and the rear of the coil, and a moving member configured to move the treatment object through an internal space surrounded by the coil.

In accordance with example embodiments of inventive concepts, a reflow method of a solder ball provided to a treatment object may include providing a coil, applying a current to the coil, and moving the treatment object through an internal space surrounded by the coil.

In accordance with example embodiments of inventive concepts, a reflow process of a solder ball provided to a treatment object is provided. The reflow process may include a step of providing a coil, a step of applying a current to the coil, and a step of relatively moving the treatment object or the coil so that the treatment object passes through an internal space surrounded by the coil.

BRIEF DESCRIPTION OF THE DRAWINGS

Example embodiments of inventive concepts will be more clearly understood from the following detailed description taken in conjunction with the accompanying drawings. FIGS. 1A-27 represent non-limiting, example embodiments of inventive concepts as described herein.

FIG. 1A is a perspective view illustrating an example of a treatment object to which example embodiments of inventive concepts may be applied.

FIG. 2 is a top plan view illustrating an example of a package apparatus according to example embodiments of inventive concepts.

FIG. 3 is a perspective view illustrating an example of a reflow apparatus of FIG. 2.

FIG. 4 is a perspective view illustrating an example of a support member of FIG. 3.

FIG. 5 is a perspective view illustrating a heating member of FIG. 2.

FIG. 6 is a perspective view illustrating a method of performing a reflow process in an apparatus of FIG. 2.

FIG. 7 is a perspective view illustrating a modified example of the heating member of FIG. 5.

FIG. 8 is a perspective view illustrating another example of the heating member of FIG. 5.

FIG. 9 is a perspective view illustrating a reflow apparatus including the heating member of FIG. 8.

FIG. 10 is a perspective view illustrating a modified example of the heating member of FIG. 8.

FIG. 11 is a perspective view illustrating another example of the heating member of FIG. 5.

FIG. 12 is a perspective view illustrating a reflow apparatus including the heating member of FIG. 11.

FIG. 13 is a perspective view illustrating a modified example of the heating member of FIG. 11.

FIG. 14 is a perspective view illustrating another example of the heating member of FIG. 5.

FIG. 15 is a perspective view illustrating a reflow apparatus including the heating member of FIG. 14.

FIG. 16 is a perspective view illustrating a modified example of the heating member of FIG. 14.

FIG. 18 is a perspective view illustrating a method of performing a reflow process using the heating member of FIG. 17A.

FIG. 19 is a perspective view illustrating another example of a reflow apparatus of FIG. 3.

FIG. 20 is a perspective view of an input magazine of FIG. 19.

FIGS. 21 through 23 are views sequentially illustrating a method of performing a reflow process in an apparatus of FIG. 19.

FIG. 24 is a perspective view illustrating another example of a reflow apparatus.

FIG. 25 is a view illustrating a method of performing a reflow process in an apparatus of FIG. 24.

FIG. 26 is a perspective view illustrating another example of a reflow apparatus of FIG. 3.

FIG. 27 is a perspective view illustrating another example of a reflow apparatus of FIG. 3.

DETAILED DESCRIPTION OF EXAMPLE EMBODIMENTS OF INVENTIVE CONCEPTS

Figure 1A:
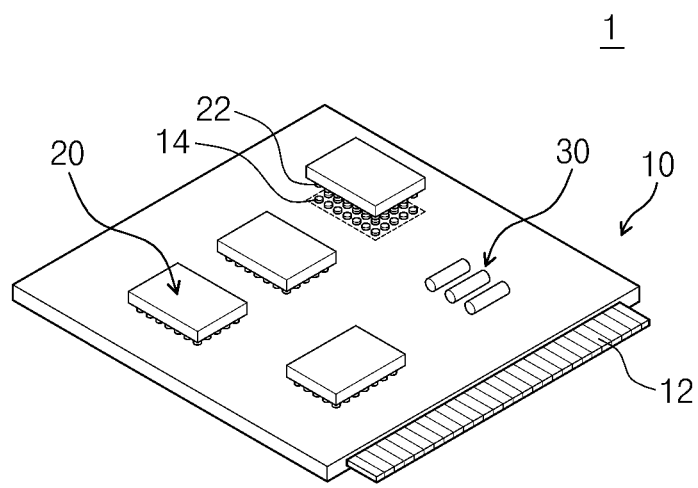

Example embodiments of inventive concepts will now be described more fully with reference to the accompanying drawings, in which example embodiments of inventive concepts are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments of inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments of inventive concepts are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments of inventive concepts.

An apparatus according to example embodiments of inventive concepts may perform a reflow of a solder ball 22 provided on a treatment object 1. The treatment object 1, for example, may be a printed circuit board 10 on which a semiconductor chip 20 is mounted. The semiconductor chip 20 may be mounted on the printed circuit board 10 via a chip mounting process. FIG. 1A illustrates an example of the printed circuit board 10 on which the semiconductor chip 20 is mounted. The printed circuit board 10 may be supplied as a shallow plate shape. Connection terminals 12, which may be configured to electrically connect the printed circuit board 10 to an external electronic device (not shown), may be formed on one side of the printed circuit board 10. Connection terminals 14, e.g. pads, may be formed on a top surface of the printed circuit board 10 to electrically connect the semiconductor chip 20 to the printed circuit board 10. The connection terminal 12 and the pads 14 may be electrically connected to one another through a plurality of conductive lines (not shown) formed on the printed circuit board 10. The semiconductor chip 20 may be placed on the printed circuit board 10 so that the solder ball 22 is in contact with the pad 14.

Figure 1B:
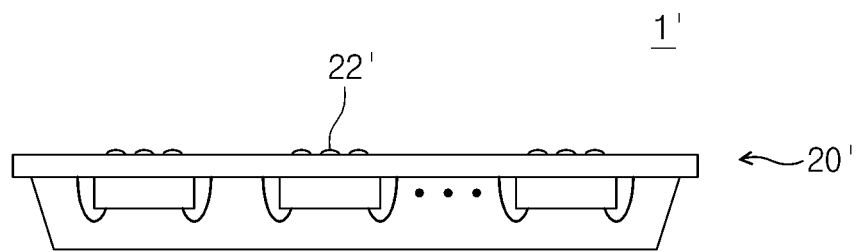
FIG. 1B is a perspective view illustrating another example of a treatment object according to example embodiments of inventive concepts.

As an alternative, a treatment object 1' may be a semiconductor chip 20' to which a solder ball 22' attaches. In accordance with example embodiments of inventive concepts, the solder balls 22' may be attached to the semiconductor chip 20' via a ball attach process. Referring to FIG. 1B, the treatment object 1' may be a semiconductor chip or a plurality of semiconductor chips which are not separated.

The treatment objects in FIGS. 1A and 1B are not limited to the aforementioned semiconductor chips 20' or printed circuit board 10, and may be various kinds of parts having an external terminal which need a reflow process for the solder ball 22. Below, a case where the treatment object is the printed circuit substrate 10 on which the semiconductor chip 20 is mounted is described.

FIG. 2 is a top plan view illustrating a package apparatus 2 according to example embodiments of inventive concepts. The package apparatus 2 may include a first unit 40, a second unit 50 and a third unit 60. The second unit 50 may be configured to heat the solder ball 22 of the semiconductor chip 20 which may be mounted on the printed circuit board 10 to perform a reflow process of the solder ball 22. The first unit 40 may be a loader unit providing the printed circuit board 10 on which the semiconductor chip 20 is mounted to the second unit 50 and the third unit 60 may be an unloader unit unloading the printed circuit board 10 of which a reflow process may be finished from the second unit 50 to the outside. As an alternative, the first unit 40 or the third unit 60 may be a unit to perform a package process in-line with the second unit 50. For example, the first unit 40 may be a unit to perform a process of mounting the semiconductor chip 20 on the printed circuit board 10. Also, when the treatment object 1' is the semiconductor chip 20' of FIG. 1B, the first unit 40 may be a unit to attach the semiconductor chip 20' to the solder ball 22'.

The first unit 40, the second unit 50, and the third unit 60 may be sequentially provided in a specific direction. Hereinafter, a direction perpendicular to a direction in which the first unit 40, the second unit 50 and the third unit 60 are arranged is called as a first direction 62, the direction in which the first unit 40, the second unit 50 and the third unit 60 are arranged is called as a second direction 64, and a direction perpendicular to the first direction 62 and the second direction 64 is called as a third direction 66. A plane provided by the first direction 62 and the second direction 64 is a plane parallel to a top surface of the printed circuit board 10 placed on conveyers (220, 240 of FIG. 4).

Figure 3:
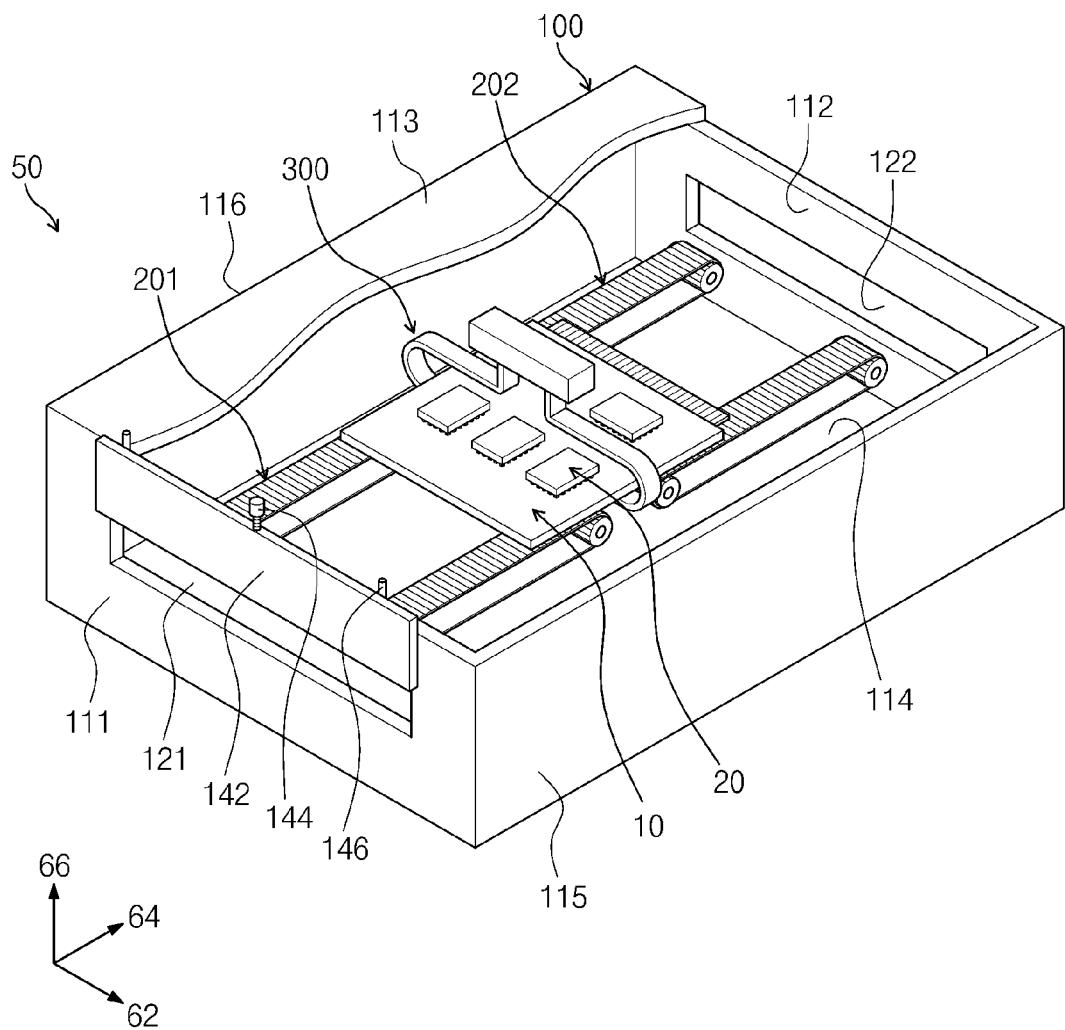

Hereinafter, the second unit 50 is called as a reflow apparatus and a structure of the reflow apparatus 50 is described in detail. FIG. 3 is a perspective view illustrating an example of the reflow apparatus 50 of FIG. 2.

Figure 4:
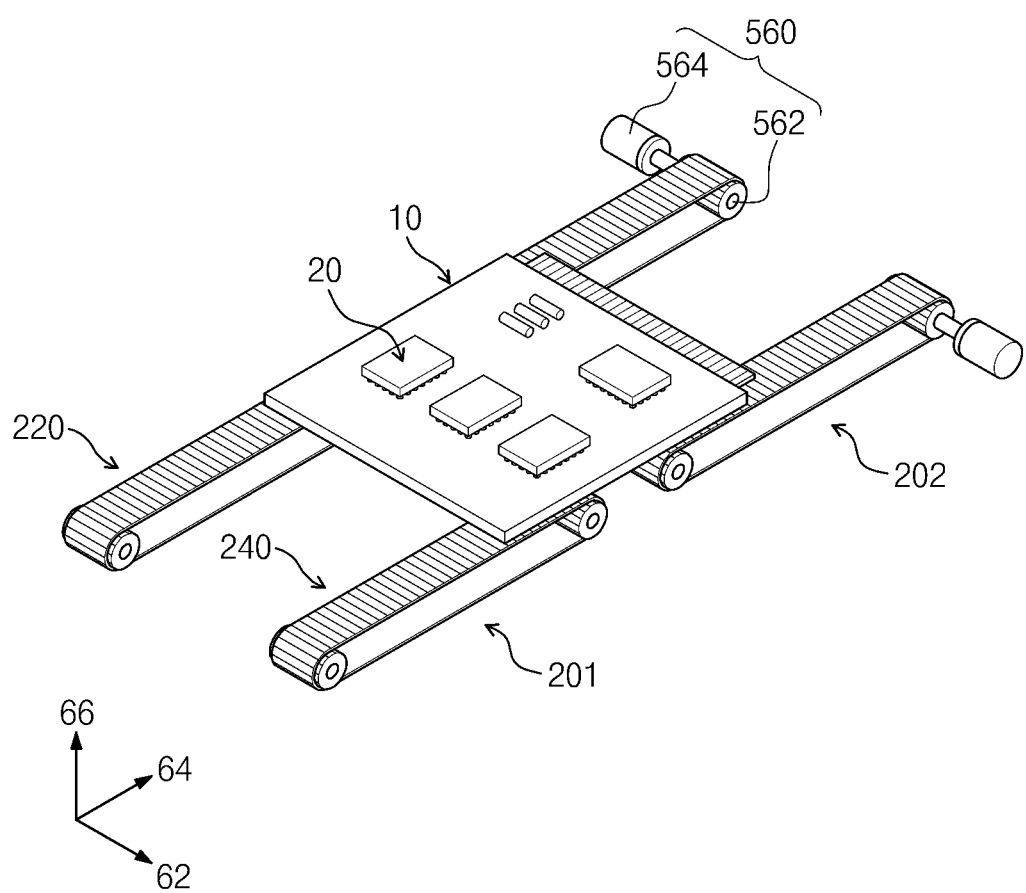

Referring to FIGS. 2 and 3, the reflow apparatus 50 may include a housing 100, a support member 200, a heating member 300, and a moving member (560 of FIG. 4). The housing 100 may have a rectangular parallelepiped shape and the inside of the housing 100 may include a space in which the support member 200, the heating member 300, and the moving member 560 are installed. The support member 200 may support the printed circuit board 10 in the housing 100. The support member 200 may include an input supporter 201 and an output supporter 202. The input supporter 201 may be located in front of the heating member 300 and the output supporter 202 may be located at the rear of the heating member 300. The printed circuit board 10 may be placed on the input supporter 201 before a reflow process is performed and the printed circuit board 10 of which a reflow process is finished may be placed on the output supporter 202. The moving member 560 may provide a driving power so that the printed circuit board 10 moves from the input supporter 201 to the output supporter 202 through the heating member 300. The heating member 300 may be disposed between the input supporter 201 and the output supporter 202. The heating member 300 may heat the printed circuit board 10 which may move from the input supporter 201 to the output supporter 202. The heating member 300 may perform a reflow process on the solder ball 22.

The housing 100 may be formed of metal material to cutoff an electromagnetic interference with the outside. For example, the housing 100 may be formed of aluminum material. A lengthwise direction of the housing 100 may be disposed along the second direction 64. The housing 100 may include a front wall 111, a rear wall 112, a top wall 113, a bottom wall 114, a first sidewall 115, and a second sidewall 116. The front wall 111 may face the first unit 40 and the rear wall 112 may face the third unit 60. An entrance 121 functioning as a path for inputting the printed circuit board 10 to the housing 100 may be formed at the front wall 111 and an exit 122 functioning as a path for outputting the printed circuit board 10 from the housing 100 may be formed at the rear wall 112. A shutter 142 opening and shutting the entrance 121 may be installed on the front wall 111 and a shutter (not shown) opening and shutting the exit 122 may be installed on the rear wall 112. Each shutter may be linearly moved in an up and down direction by a cylinder 144. A guide 146 may be provided on the front wall 111 and the rear wall 112 to guide a linear movement of the shutter 142. The shutter 142 may be formed of metal material such as aluminum to cutoff an electromagnetic interference.

FIG. 4 is a perspective view illustrating an example of a support member. As described above, the support member 200 may include an input supporter 201 and an output supporter 202. The input and output supporters 201 and 202 may have the same shape. The input and output supporters 201 and 202 may be symmetrically disposed with respect to the heating member 300. The input and output supporters 201 and 202 may be disposed to be adjacent to the heating member 300. According to example embodiments of inventive concepts, the input supporter 201 may include a pair of conveyers 220 and 240. A lengthwise direction of each of the conveyers 220 and 240 may be disposed along the second direction 64. The pair of conveyers 220 and 240 may be disposed to be spaced apart from each other along the first direction 62 and to face each other. Both edges of the printed circuit board 10 are placed on top surfaces of the pair of conveyers 220 and 240 respectively.

The moving member 560 may provide a driving power to the conveyers 220 and 240 so that each of the conveyers 220 and 240 rotates to form a closed path. The moving member 560 may include rollers 562 and motors 564. The rollers 562 may be disposed on the inside of each of the conveyers 220 and 240 to be engaged with the conveyers 220 and 240. The motor 564 may be connected to at least one of two rollers 562 provided to each of the conveyers 220 and 240. The printed circuit board 10 may be placed on the pair of conveyers 220 and 240 and may linearly move from the input supporter 201 to the output supporter 202 by rotations of the conveyers 220 and 240.

The heating member 300 may heat the solder ball 22 mounted on the printed circuit board 10 to perform a reflow process. The heating member 300 may heat the solder ball 22 using an induction heating method. When an alternating current is applied to a coil, an alternating magnetic field is generated around the coil. An eddy current is generated to be perpendicular to the magnetic field direction in a conductor (treatment object) provided to a region where the magnetic field is generated. The eddy current flows along a surface of the conductor (treatment object) and generates heat. The induction heating method is a method for heating the conductor (treatment object) using a heat generated when the eddy current flows along a surface of the conductor (treatment object).

Figure 5:
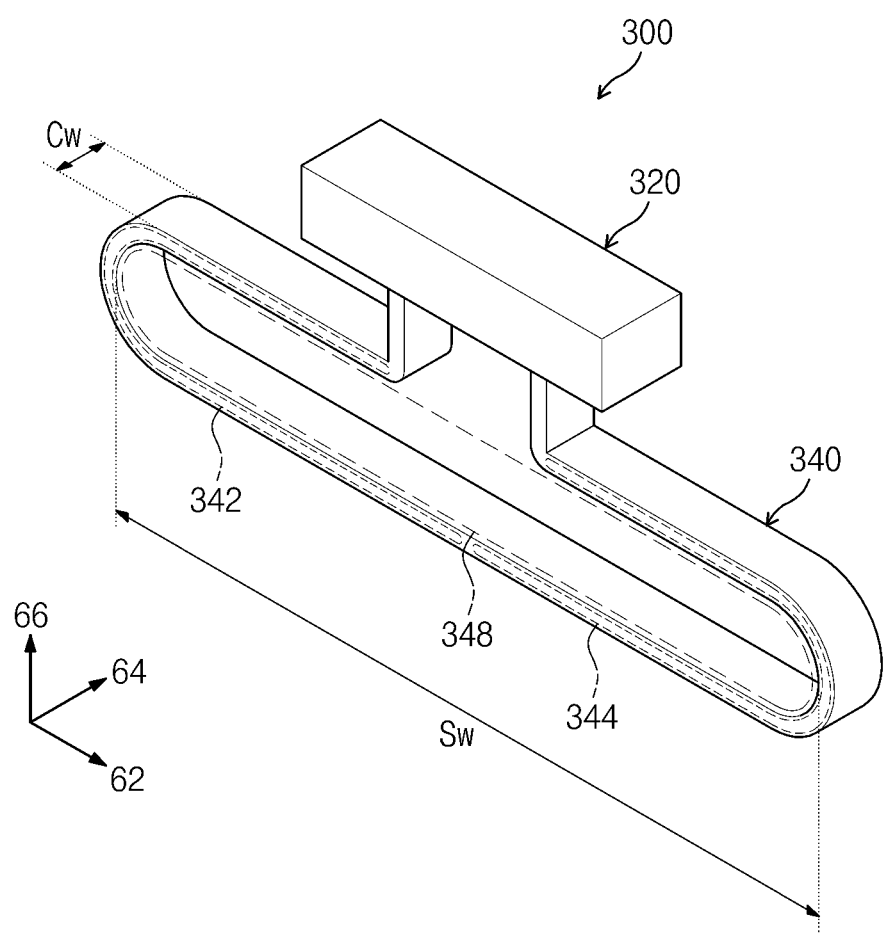

FIG. 5 is a perspective view illustrating a heating member 300 in accordance with example embodiments of inventive concepts. The heating member 300 may include a power supply 320 and a coil 340. The coil 340 may be electrically connected to the power supply 320 to receive an alternating current from the power supply 320. An internal space 348 through which the printed circuit board 10 may pass is provided in the inside of the coil 340. The internal space 348 is a space surrounded by the coil 340.

The coil 340 may include a first line portion 342 and a second line portion 344. The first and second line portions 342 and 344 may have the same shape. The second line portion 344 may continuously extend from an edge of the first line portion 342. The first and second line portions 342 and 344 may have the same width (Cw) across the whole length. Widths of the first and second line portions 342 and 344 may be perpendicular to lengthwise directions thereof. The first and second line portions 342 and 344 may be symmetrically disposed with respect to a virtual plane crossing a space between the first and second line portions 342 and 344. The first line portion 342 may have a convex shape toward a direction opposed to a direction facing the second line portion 344. A region provided between the first and second line portions 342 and 344 may be defined as an internal space 348 described above. The internal space 348 has the front and the rear which are opened and the side surrounded by the first and second line portions 342 and 344. The internal space 348 has a width (Sw) longer than a first side of the printed circuit board 10. The first side of the printed circuit board 10 may be perpendicular to the second direction 64 in which the printed circuit board 10 moves.

Figure 6:
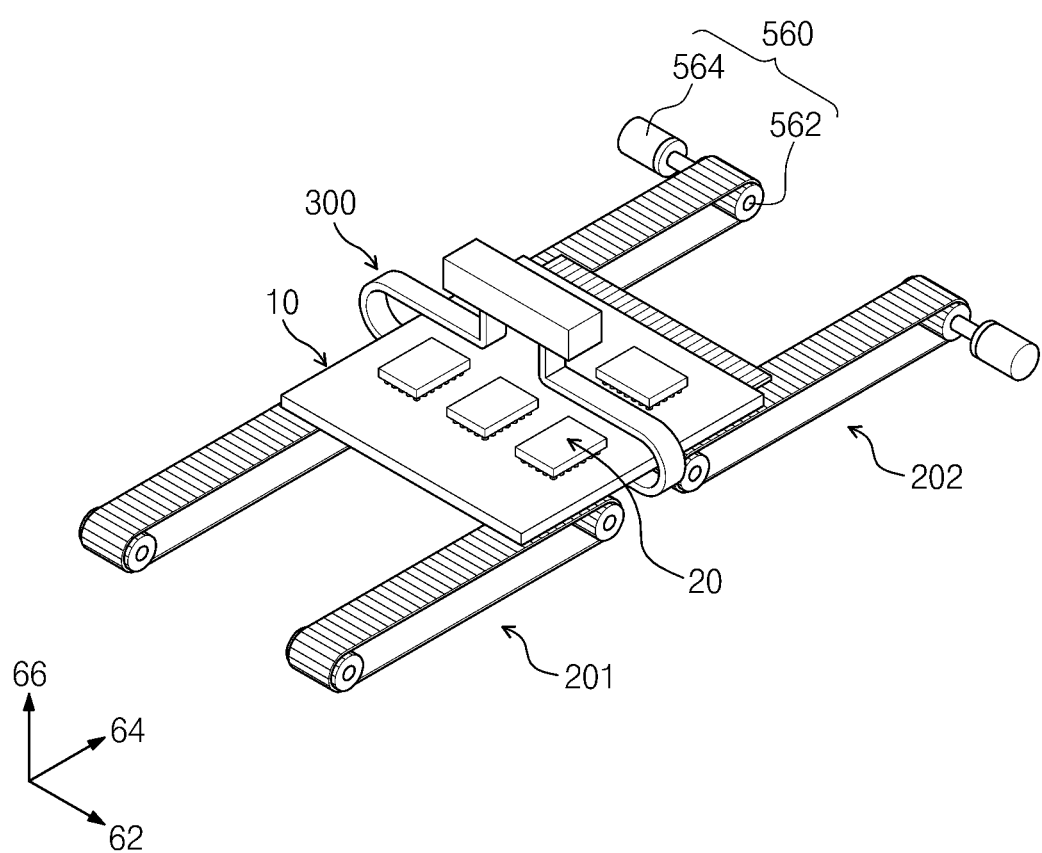

FIG. 6 is a perspective view illustrating a reflow process using the second unit 50. Referring to FIGS. 4, 5, and 6, the coil 340 may be disposed between the input supporter 201 and the output supporter 202. The front of the internal space 348 of the coil 340 may be disposed to face the input supporter 201 and the rear of the internal space 348 of the coil 340 may be disposed to face the output supporter 202. A portion of first line portion 342 and a portion of the second line portion 344 may be disposed to be lower than the printed circuit board 10 placed on the input supporter 201 and the other portion of first line portion 342 and the other portion of the second line portion 344 may be disposed to be higher than the printed circuit board 10. An alternating current may be applied to the coil 340 from the power supply 320. The printed circuit board 10 on which the semiconductor chip 20 may be mounted may be placed on the conveyers 220 and 240 of the input supporter 201. As the conveyers 220 and 240 of the input supporter 201 rotate, the printed circuit board 10 may linearly move along the second direction 64. The printed circuit board 10 may pass through the internal space 348 of the coil 340 to move from the front of the coil 340 to the rear of the coil 340 and a reflow process of the solder balls 22 may be performed by an induced heating while the printed circuit board 10 moves.

Figure 7:
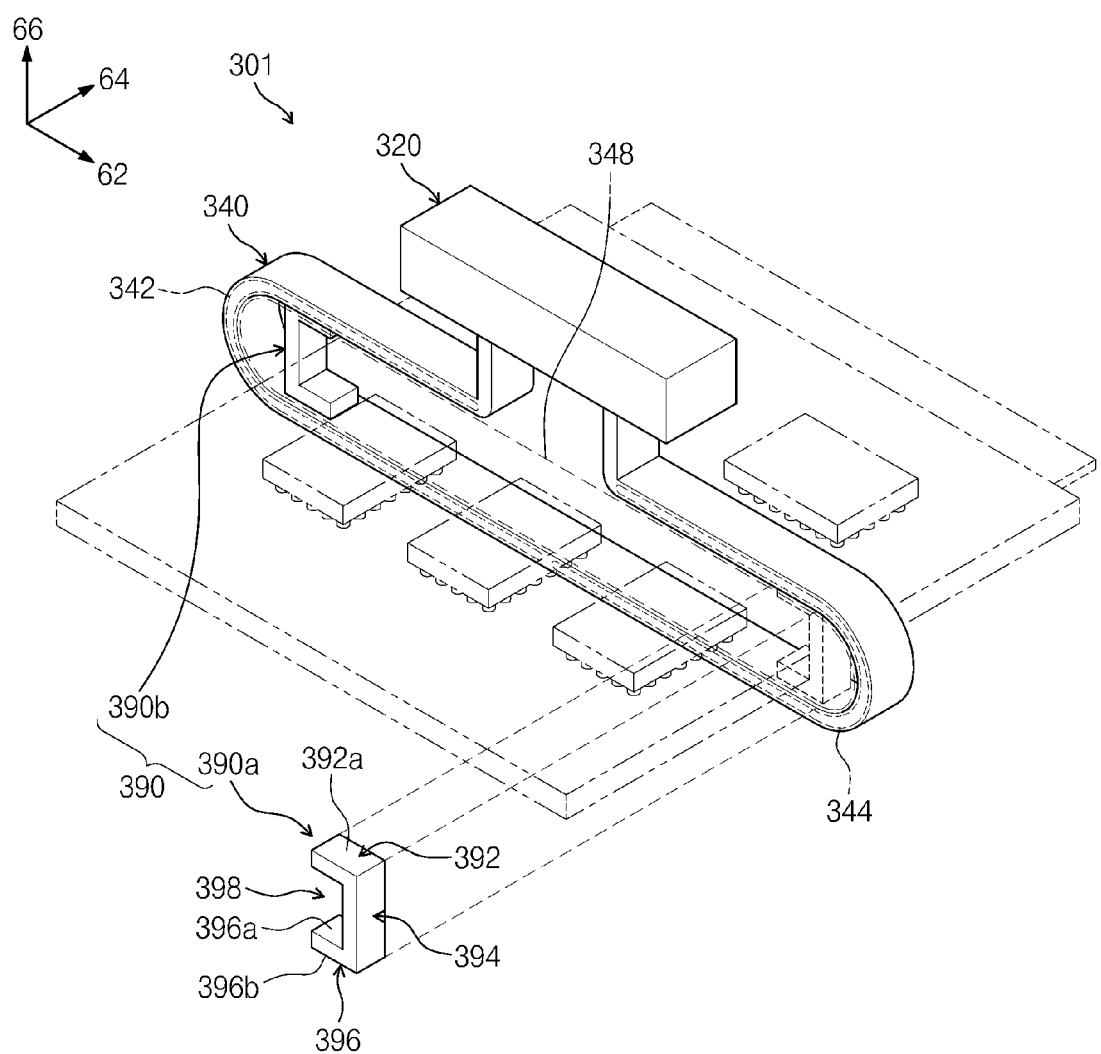

FIG. 7 is a perspective view illustrating a modified example of the heating member 300 of FIG. 5. In accordance with example embodiments of inventive concepts, the heating member 301 of FIG. 7 may include the power supply 320, the coil 340 and a guide member 390. The power supply 320 and the coil 340 may have the same structure and shape as the power supply 320 and the coil 340 of FIG. 5. The guide member 390 may be disposed in the internal space 348 of the coil 340 to guide a movement of the printed circuit board 10. According to example embodiments of inventive concepts, the guide member 390 may include a first block 390a and a second block 390b. The first block 390a may be disposed in a region provided by the second line portion 344 and the second block 390b may be disposed in a region provided by the first line portion 342. The first and second blocks 390a and 390b associate with each other to guide the printed circuit board 10. The first and second blocks 390a and 390b may be disposed in the first direction 62 to be spaced a distance corresponding to the first side of the printed circuit board 10 apart from each other. The first block 390a may support one edge of the printed circuit board 10 and the second block 390b may support another edge of the printed circuit board 10.

The first block 390a may include a top wall 392, a sidewall 394 and a bottom wall 396. The top wall 392 and the bottom wall 396 may be disposed to be parallel to each other and the side wall 394 may extend from one end of the top wall 392 to one end of the bottom wall 396. Thus, the first block 390a may include insertion portion 398 defined by the top wall 392, the sidewall 394 and the bottom wall 396. The front and the rear of the insertion portion 398 may be open and the side of the insertion portion 398 facing the first block 390a may also open. A top surface 396a of the bottom wall 396 may be exposed by the insertion portion 398 and may be in contact, with an edge of the printed circuit board to provide the printed circuit board with a support surface for supporting an edge of the printed circuit board. The first block 390a and the second block 390b may be fixedly installed on the coil 340. According to example embodiments of inventive concepts, a bottom surface 396b of the bottom wall 396 and a top surface 392a of the top wall 392 of the first block 390a may be fixedly in contact with the coil 340 respectively.

The first block 390a and the second block 390b may have the same shape. The first block 390a and the second block 390b may be symmetrically disposed with respect to the virtual plane described above.

In example embodiments of inventive concepts, the first block 390a and the second block 390b may include only the top wall 392 and the sidewall 394 without the bottom wall 396. Also, the first block 390a and the second block 390b may be detached from the coil 340. The first block 390a and the second block 390b may also be disposed in the internal space 348 of the coil 340 to be separated from the coil 340.

Figure 8:
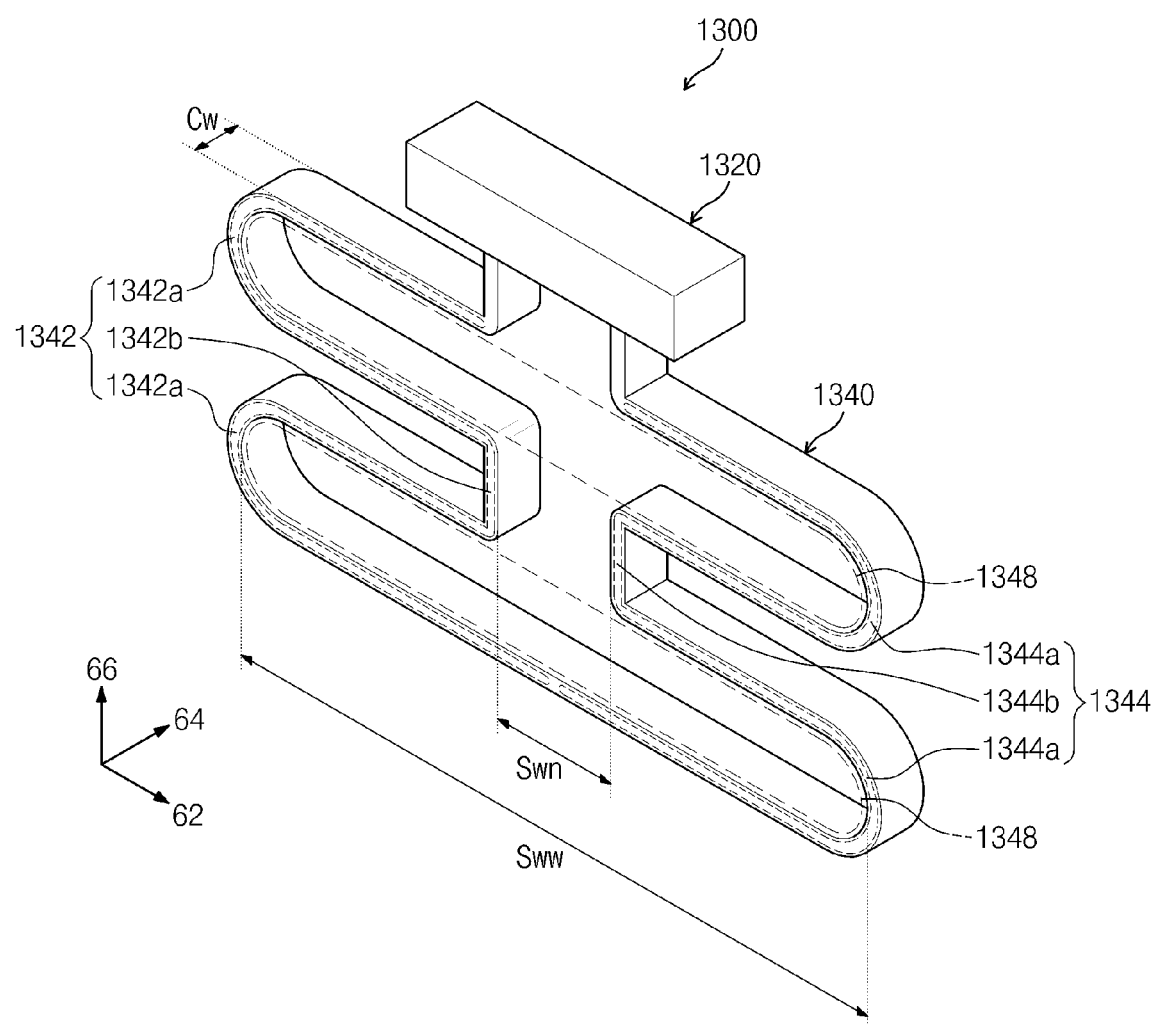

FIG. 8 is a perspective view illustrating another example of the heating member. The heating member 1300 of FIG. 8 may include a power supply 1320 and a coil 1340. The coil 1340 may be electrically connected to the power supply 1320 to receive an alternating current from the power supply 1320. A plurality of internal spaces 1348 through which the printed circuit board 10 may pass may be provided to the inside of the coil 1340. Each of the internal spaces 1348 may be a space surrounded by the coil 1340. As shown in FIG. 8, the internal spaces 1348 may be separated from one another.

The coil 1340 may include a first line portion 1342 and a second line portion 1344. The first and second line portions 1342 and 1344 may have the same shape. The second line portion 1344 may continuously extend from an edge of the first line portion 1342. The first and second line portions 1342 and 1344 may have the same width (Cw) across the whole length. The first and second line portions 1342 and 1344 may be symmetrically disposed with respect to a virtual plane crossing a space between the first and second line portions 1342 and 1344.

The first portion 1342 may include a plurality of enlarged portions 1342a and reduced portions 1342b. Each of the enlarged portions 1342a may be convex to a direction opposed to a side facing the second line portion 1344. The reduced portion 1342b may be disposed between the adjacent enlarged portions 1342a. A width (Swn) of a region between a reduced portion 1342b of the first line portion 1342 and a reduced portion 1344b of the second line portion 1344 facing the reduced portion 1342b of the first line portion 1342 may be smaller than a width (Sww) of a region between an enlarged portion 1342a of the first line portion 1342 and an enlarged portion 1344a of the second line portion 1344 facing the enlarged portion 1342a of the first line portion 1342. A region between an enlarged portion 1342a of the first line portion 1342 and an enlarged portion 1344a of the second line portion 1344 facing the enlarged portion 1342a of the first line portion 1342 may be provided as the internal space 1348 described above. Each of the internal spaces 1348 may be separated by the reduced portions 1342b and 1344b of the first and second line portions 1342 and 1344. The front and the rear of each internal space 1348 may be open and the side of each internal space 1348 may be surrounded by one of the enlarged portions 1342a of the first line portion 1342 and one of the enlarged portions 1344a of the second line portion 1344.

In FIG. 8, the first line portion 1342 and the second line portion 1344 may have two enlarged portions 1342a and 1344a respectively. However, in example embodiments of inventive concepts, the first line portion 1342 and the second line portion 1344 may have three or more enlarged portions respectively.

Figure 9:
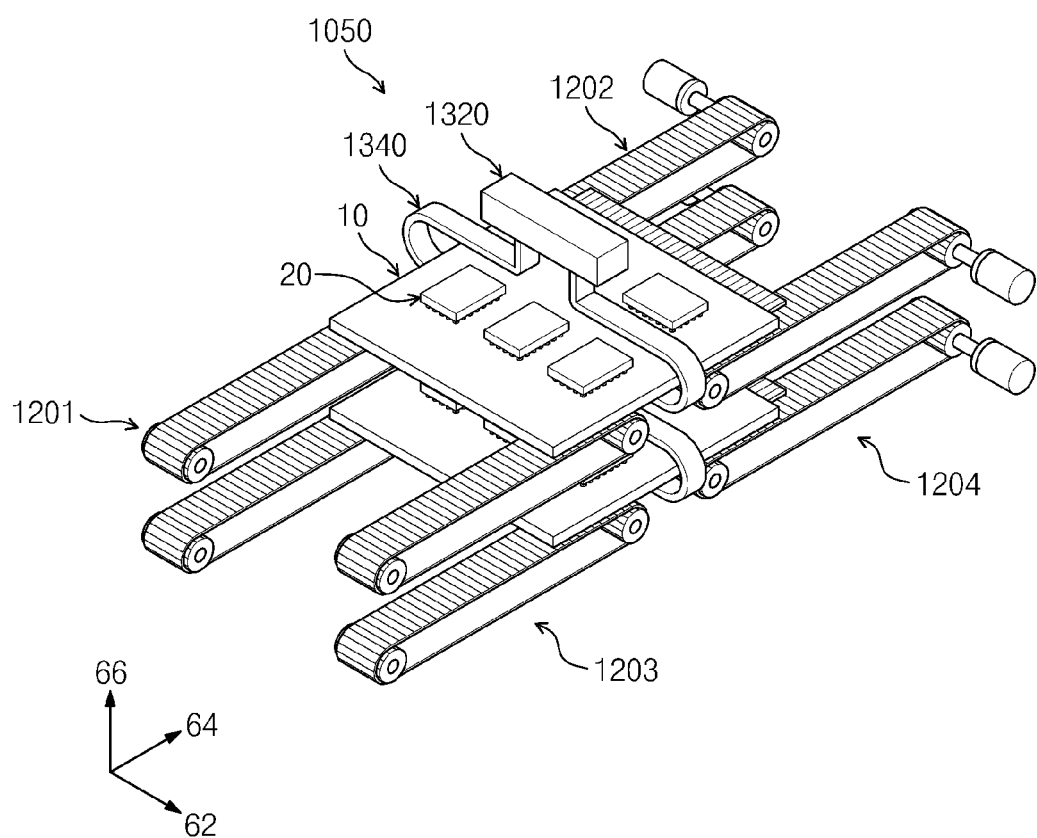

FIG. 9 is a perspective view illustrating a reflow apparatus 1050 including the heating member 1300 of FIG. 8. The coil 1340 may be disposed between input supporters 1201 and 1203 and output supporters 1202 and 1204 so that the internal spaces 1348 may be spaced in a third direction 66 apart from one another. The number of the input supporters 1201 and 1203 and the number of the output supporters 1202 and 1204 are equal to the number of the internal spaces 1348 provided to the coil 1340 respectively. The input supporters 1201 and 1203 may be spaced a predetermined or preset distance along the third direction 66 apart from each other. One of the input supporters 1201 and 1203 and one of the output supporters 1202 and 1204 may constitute a pair and may have the same height. One enlarged portion 1342a may be disposed to face a pair of input supporter and output supporter (1201, 1202 or 1203, 1204). For example, a portion of enlarged portion 1342a may be disposed to be lower than the printed circuit board 10 placed on the input supporter 1201 and the other portion of enlarged portion 1342a may be disposed to be higher than the printed circuit board 10 placed on the input supporter 1201. The internal space 1348 may have a width (Sww) longer than a first side of the printed circuit board 10. The first side of the printed circuit board 10 may be perpendicular to a second direction 64 in which the printed circuit board 10 moves.

The coil 1340 may receive an alternating current from the power supply 1320. The printed circuit board 10 on which the semiconductor chip 20 including a solder ball 22 is mounted may be placed on the conveyer of each of the input supporters 1201 and 1203. As the conveyer of the input supporters 1201 and 1203 rotates, the printed circuit board 10 may linearly move along the second direction 64. Each of the printed circuit boards 10 may pass through the internal space 1348 of the coil 1340 disposed to correspond to the printed circuit boards 10 to move from the front of the coil 1340 to the rear of the coil 1340 and a reflow process of the solder balls 22 may be performed by an induced heating while the printed circuit board 10 moves through the heating member 1300.

Figure 10:
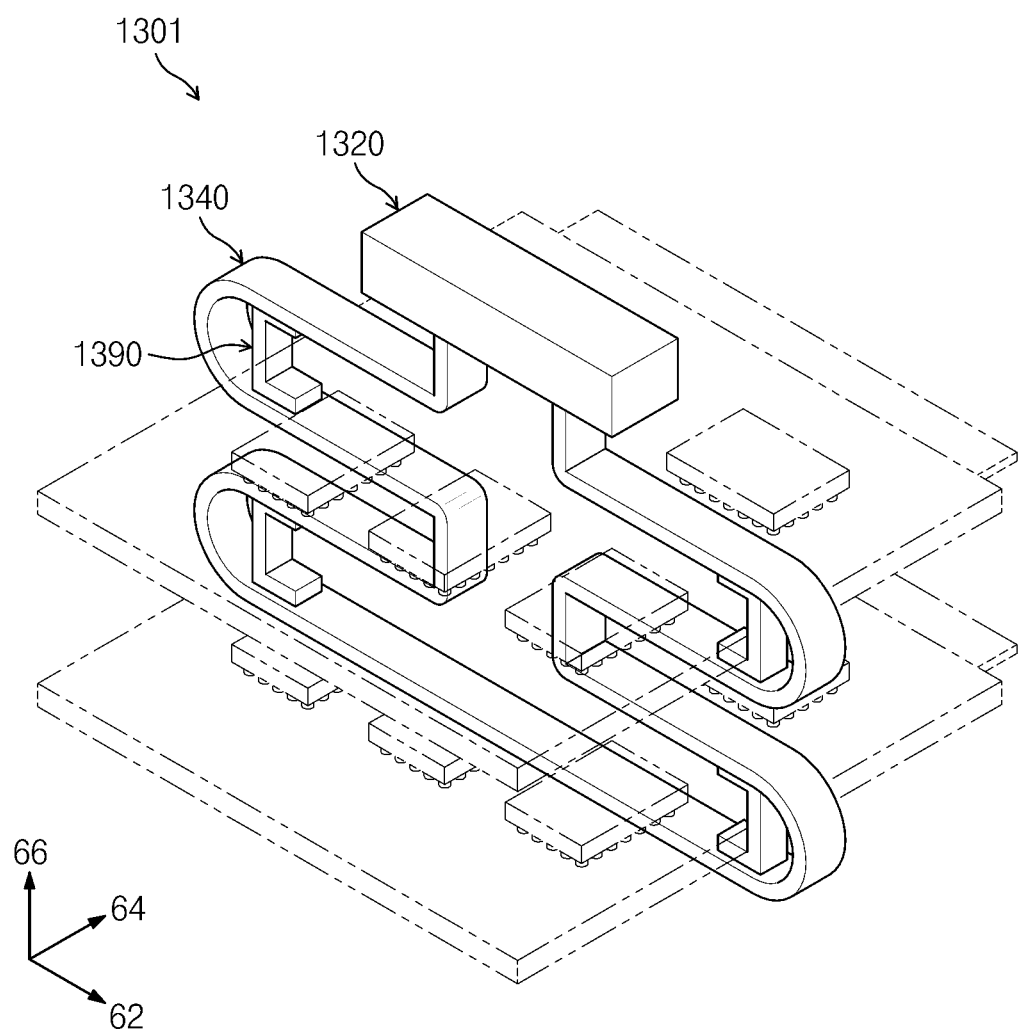

FIG. 10 is a perspective view illustrating a modified example of the heating member 1300 of FIG. 8. The heating member 1301 of FIG. 10 may include a power supply 1320, a coil 1340, and a guide member 1390. The power supply 1320 and the coil 1340 of FIG. 10 may have the same structure and shape as the power supply 1320 and the coil 1340 of FIG. 8. The guide member 1390 may be disposed in the internal space 1348 of the coil 1340 to guide a movement of the printed circuit board 10. The guide member 1390 may have the same shape and structure as the guide member 390 of FIG. 7.

Figure 11:
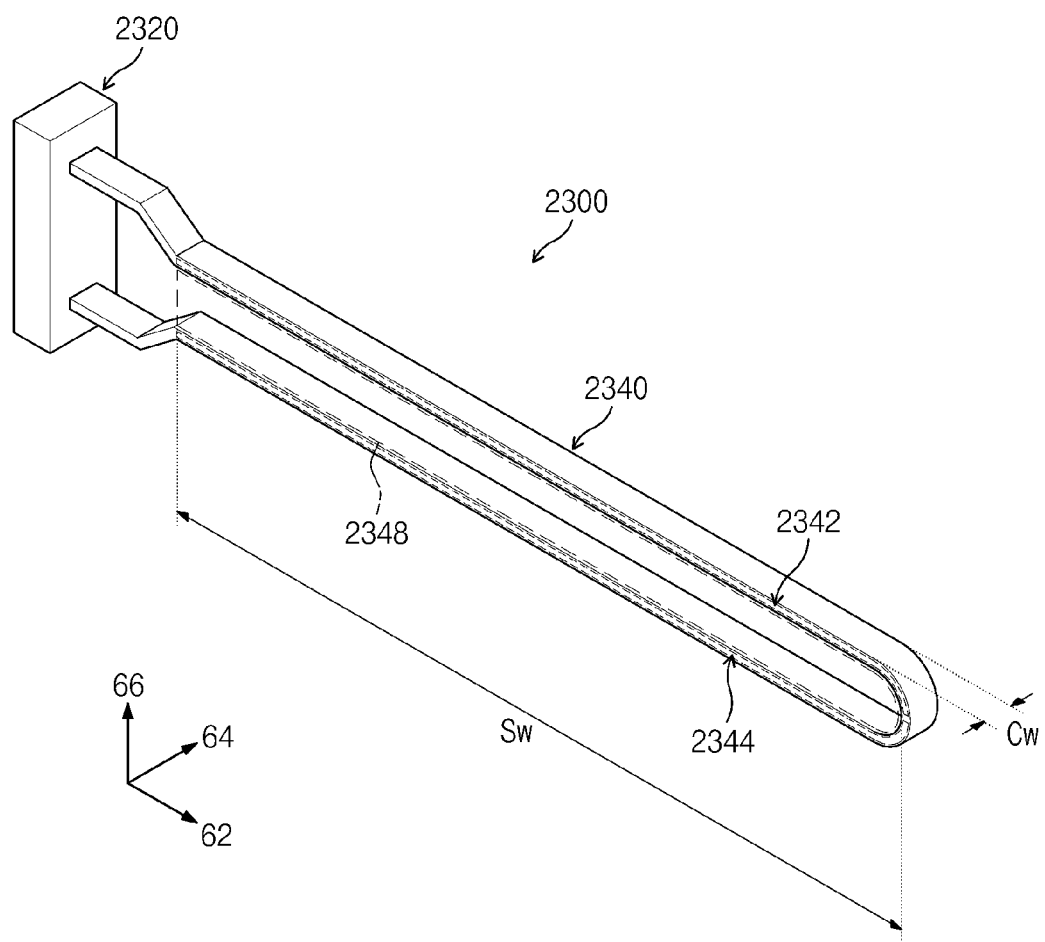

FIG. 11 is a perspective view illustrating another example of the heating member. The heating member 2300 may include a power supply 2320 and a coil 2340. The coil 2340 may be electrically connected to the power supply 2320 to receive an alternating current from the power supply 2320. An internal space 2348 through which the printed circuit board 10 may pass may be provided in the inside of the coil 2340. The internal space 2348 may be a space surrounded by the coil 2340. The coil 2340 may include a first line portion 2342 and a second line portion 2344. The first and second line portions 2342 and 2344 may have the same shape. The second line portion 2344 may continuously extend from an edge of the first line portion 2342. The first and second line portions 2342 and 2344 may have the same width (Cw) across the whole length. The first and second line portions 2342 and 2344 may be symmetrically disposed with respect to a virtual plane crossing a space between the first and second line portions 2342 and 2344. The first and second line portions 2342 and 2344 may be linearly provided and may have a rounded shape facing each other on both edges. The first and second line portions 2342 and 2344 may be combined with each other to have a 'U' shape. A region provided between the first and second line portions 2342 and 2344 is the internal space 2348. The front and the rear of the internal space 2348 may be open and the side of the internal space 2348 may be surrounded by the first and second line portions 2342 and 2344.

Figure 12:
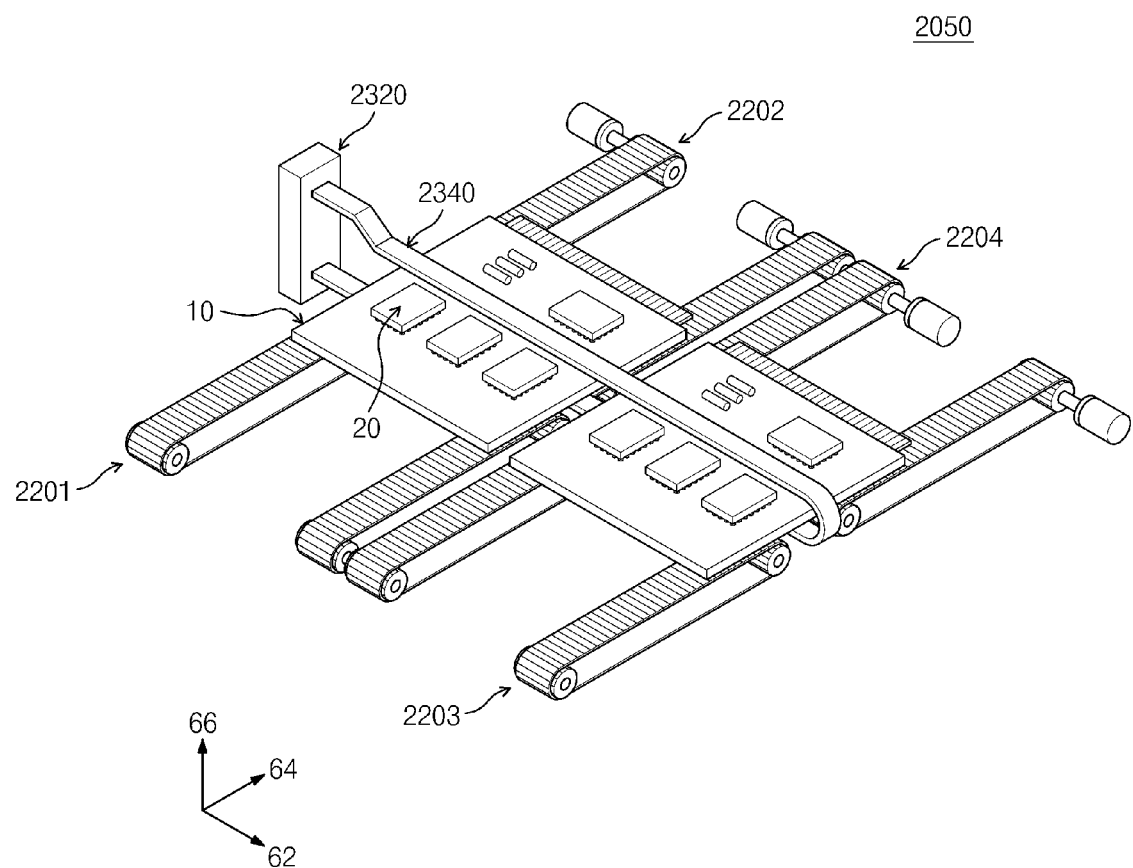

FIG. 12 is a perspective view illustrating a reflow apparatus 2050 including the heating member of FIG. 11. As shown in FIG. 12, the reflow apparatus 2050 may include plurality of input supporters 2201 and 2203 and a plurality of output supporters 2202 and 2204. The number of the input supporters 2201 and 2203 may be equal to the number of the output supporters 2202 and 2204. The input supporters 2201 and 2203 may be disposed to be spaced a predetermined or preset distance along the first direction 62 apart from one another. One of the input supporters 2201 and 2203 and one of the output supporters 2202 and 2204 constitute a pair and may be disposed to face each other. The front of the internal space 2348 of the coil 2340 may face the input supporters 2201 and 2203 and the rear of the internal space 2348 of the coil 2340 may face the output supporters 2202 and 2204. A lengthwise direction of the first line portion 2342 and the second line portion 2344 of the coil 2340 may be disposed along the first direction 62. The first line portion 2342 may be disposed to be higher than the printed circuit board 10 placed on the input supporters 2201 and 2203 and the second line portion 2344 may be disposed to be lower than the printed circuit board 10 placed on the input supporters 2201 and 2203. The internal space 2348 may have a width (Sw) more than two times as great as the first side of the printed circuit board 10. The first side of the printed circuit board 10 may be perpendicular to the second direction 64 in which the printed circuit board 10 moves.

The coil 2340 may receive an alternating current from the power supply 2320. The printed circuit board 10 on which the semiconductor chip 20 including a solder ball 22 is mounted may be placed on the conveyer of each of the input supporters 2201 and 2203. As the conveyer of the input supporters 2201 and 2203 rotates, the printed circuit board 10 may linearly move along the second direction 64. The printed circuit boards 10 may pass through the internal space 2348 of the coil 2340 to concurrently move from the front of the coil 2340 to the rear of the coil 2340 and a reflow process of the solder balls 22 may be performed by an induced heating while the printed circuit board 10 moves.

Figure 13:
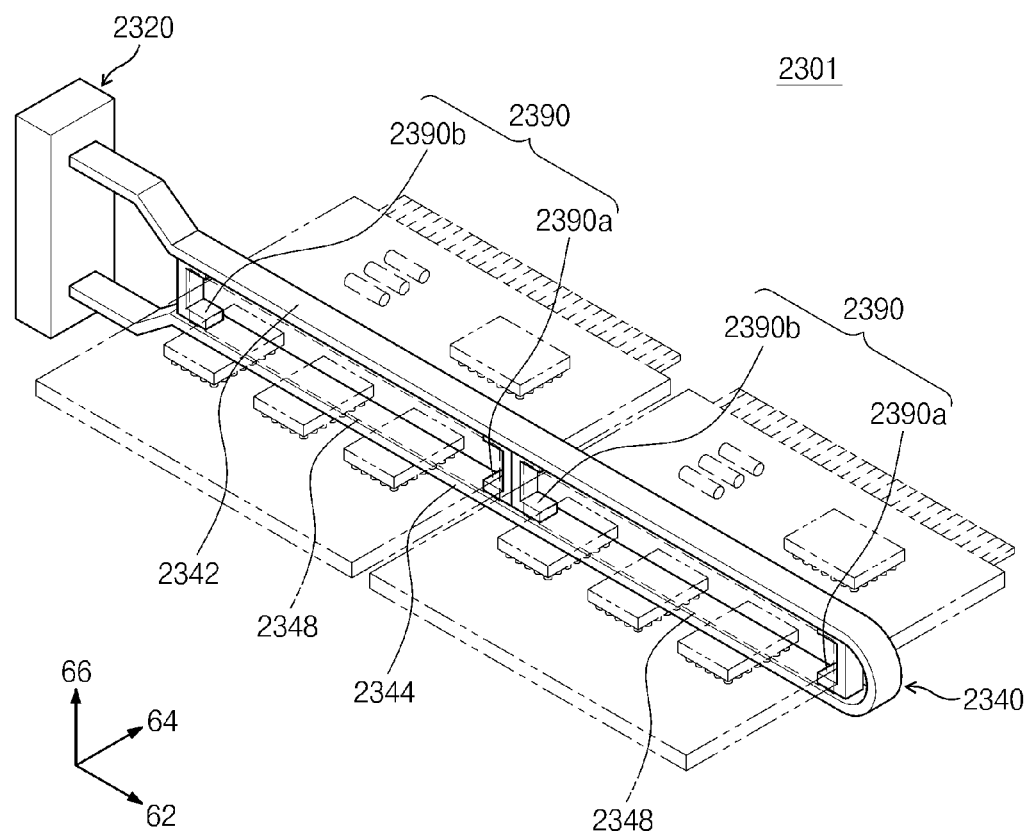

FIG. 13 is a perspective view illustrating a modified example of the heating member 2300 of FIG. 11. The heating member 2301 of FIG. 13 may include the power supply 2320, the coil 2340, and a guide member 2390. The power supply 2320 and the coil 2340 of FIG. 13 may have the same structure and shape as the power supply 2320 and the coil 2340 of FIG. 11. Each of the guide members 2390 may be disposed in a region surrounded by the first line portion 2342 and the second line portion 2344 of the coil 2340 to guide a movement of the printed circuit board 10. Each of the guide members 2390 may have the same structure and shape as the guide member 390 of FIG. 7. The guide members 2390 may be disposed in a line along the first direction 62. The coil 2340 may have a plurality of internal spaces 2348 in the inside of the coil 2340 and the internal spaces 2348 may be separated by the guide members 2390. In each guide member 2390, top walls of the first block 2390a and the second block 2390b may be in contact with the first line portion 2342 and bottom walls of the first block 2390a and the second block 2390b may be in contact with the second line portion 2344. A sidewall of the guide member 2390 of one of adjacent guide members 2390 may be in contact with a sidewall of the guide member 2390 of the other of adjacent guide members 2390.

Figure 14:
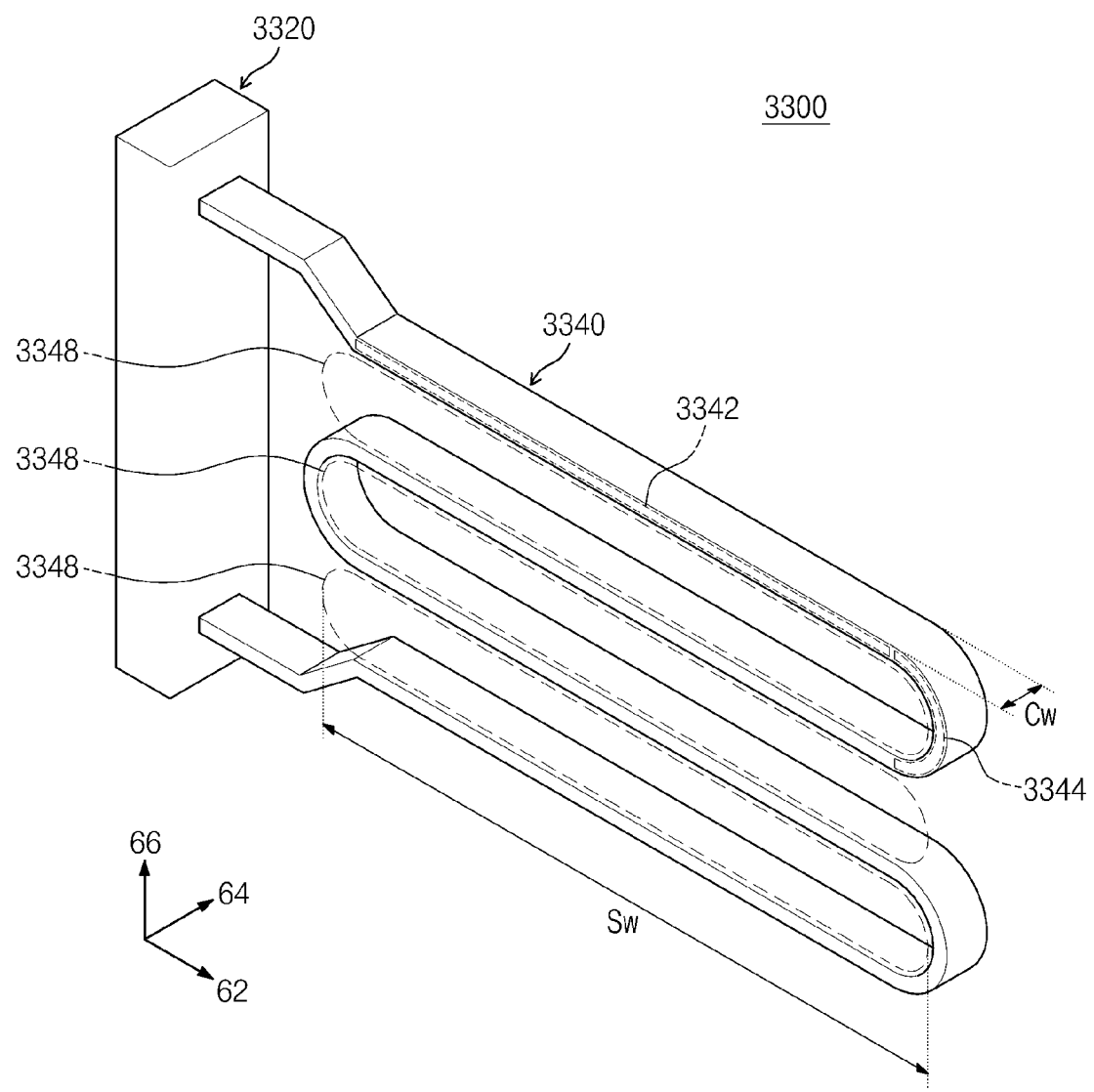

FIG. 14 is a perspective view illustrating a heating member in accordance with example embodiments of inventive concepts. The heating member 3300 may include a power supply 3320 and a coil 3340. The coil 3340 may be electrically connected to the power supply 3320 to receive an alternating current from the power supply 3320. A plurality of internal spaces 3348 through which the printed circuit board 10 may pass may be provided in the inside of the coil 3340. An internal space 3348 is a space surrounded by the coil 3340. The coil 3340 may include line portions 3342 and connection portions 3344. The line portions 3342 may be disposed to be parallel to one another and to face one another. The line portions 3342 may have similar lengths. The connection portions 3344 may connect ends of adjacent line portions 3342. The line portions 3342 and the connection portions 3344 may have the same width (Cw) across the whole length respectively. The number of the line portions 3342 may be more than three. According to example embodiments of inventive concepts, the number of the line portions 3342 may be an even number of more than four. The number of the connection portions 3344 may be less than the number of the line portions 3342 by one. The coil 3340 may be provided so that the line portion 3342 and the connection portion 3344 are sequentially and alternately disposed along a lengthwise direction of the coil 3340. The line portion 3342 may extend from an edge of one connection portion 3344 to an edge of the adjacent connection portion 3344. When four line portions 3342 and three connection portion 3344 are provided, the coil 3340 may have a 'W' shape. One internal space 3348 may be defined by adjacent two line portions 3342 and one connection portions 3344 connecting the two line portions 3342. If the front, the rear and one side of one internal space 3348 are open, the front, the rear and the other side of the adjacent internal space 3348 are open. The one side of one internal space 3348 may be opposed to the other side of the adjacent internal space 3348.

Figure 15:
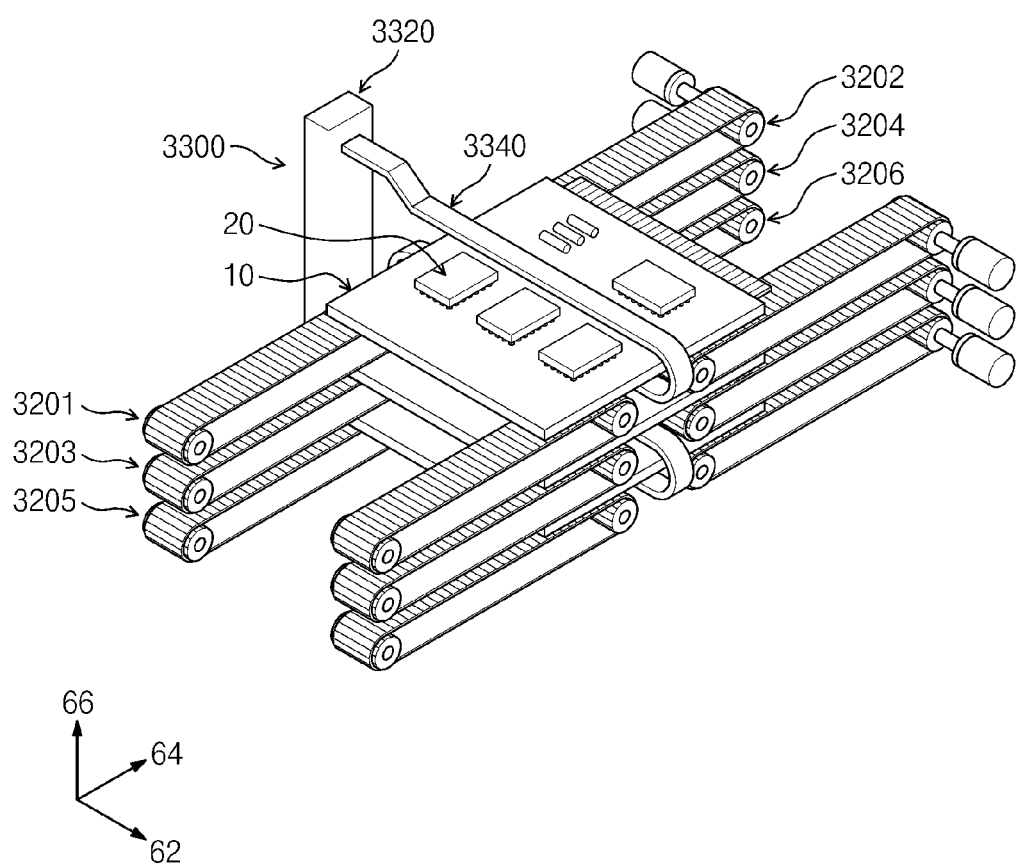

FIG. 15 is a perspective view illustrating a reflow apparatus 3050 including the heating member of FIG. 14. The number of input supporters 3201, 3203 and 3205 and the number of output supporters 3202, 3204 and 3206 may be equal to the number of internal spaces 3348 provided to the coil 3340 respectively. The input supporters 3201, 3203 and 3205 may be disposed to be spaced a predetermined or preset distance along the third direction 66 apart from one another. One input supporter and one output supporter constitute a pair and may have the same height. The coil 3340 may be disposed between the input supporters 3201, 3203 and 3205 and the output supporters 3202, 3204 and 3206 so that the internal spaces 3348 are disposed along the third direction 66. One of the internal spaces 3348 of the coil 3340 may be disposed to face a pair of the input supporter and the output supporter (3201, 3202 or 3203, 3204 or 3205, 3206). One of the line portions 3342 defining the internal space 3348 may be located lower than the printed circuit board 10 placed on the input supporter and the other of the line portions 3342 defining the internal space 3348 may be located higher than the printed circuit board 10 placed on the input supporter. The internal space 3348 may have a width (Sw) longer than a first side of the printed circuit board 10. In example embodiments of inventive concepts, the first side of the printed circuit board 10 may be perpendicular to the second direction 64.

The coil 3340 may receive an alternating current from the power supply 3320. The printed circuit board 10 on which the semiconductor chip 20 is mounted may be placed on a conveyer of each of the input supporters 3201, 3203 and 3205. As the conveyers of the input supporters 3201, 3203 and 3205 rotate, the printed circuit boards 10 may linearly move along the second direction 64. The printed circuit boards 10 passes through the internal space 3348 of the coil 3340 disposed to correspond to the printed circuit boards 10 to move from the front of the coil 3340 to the rear of the coil 3340 and a reflow process of the solder balls 22 may be performed by an induced heating while the printed circuit board 10 moves.

Figure 16:
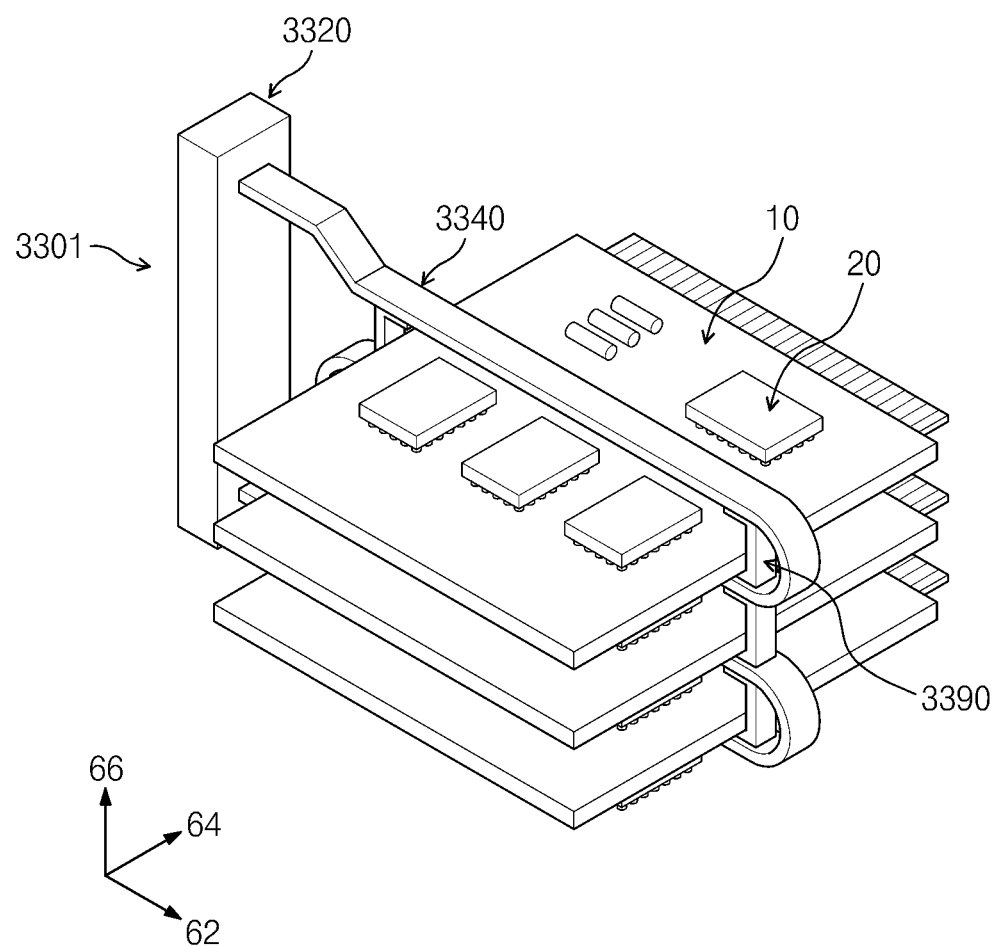

FIG. 16 is a perspective view illustrating a modified example of the heating member 3300 of FIG. 14. A heating member 3301 of FIG. 16 may include a power supply 3320, a coil 3340, and a guide member 3390. The power supply 3320 and the coil 3340 of the heating member 3301 of FIG. 16 may have the same structure and shape as the power supply 3320 and the coil 3340 of the heating member 3300 of FIG. 14. The guide member 3390 may be located on the internal space of the coil 3340 to guide a movement of the printed circuit board 10. The guide member 3390 may have the same structure and shape as the guide member 390 of FIG. 7.

Figure 17A:
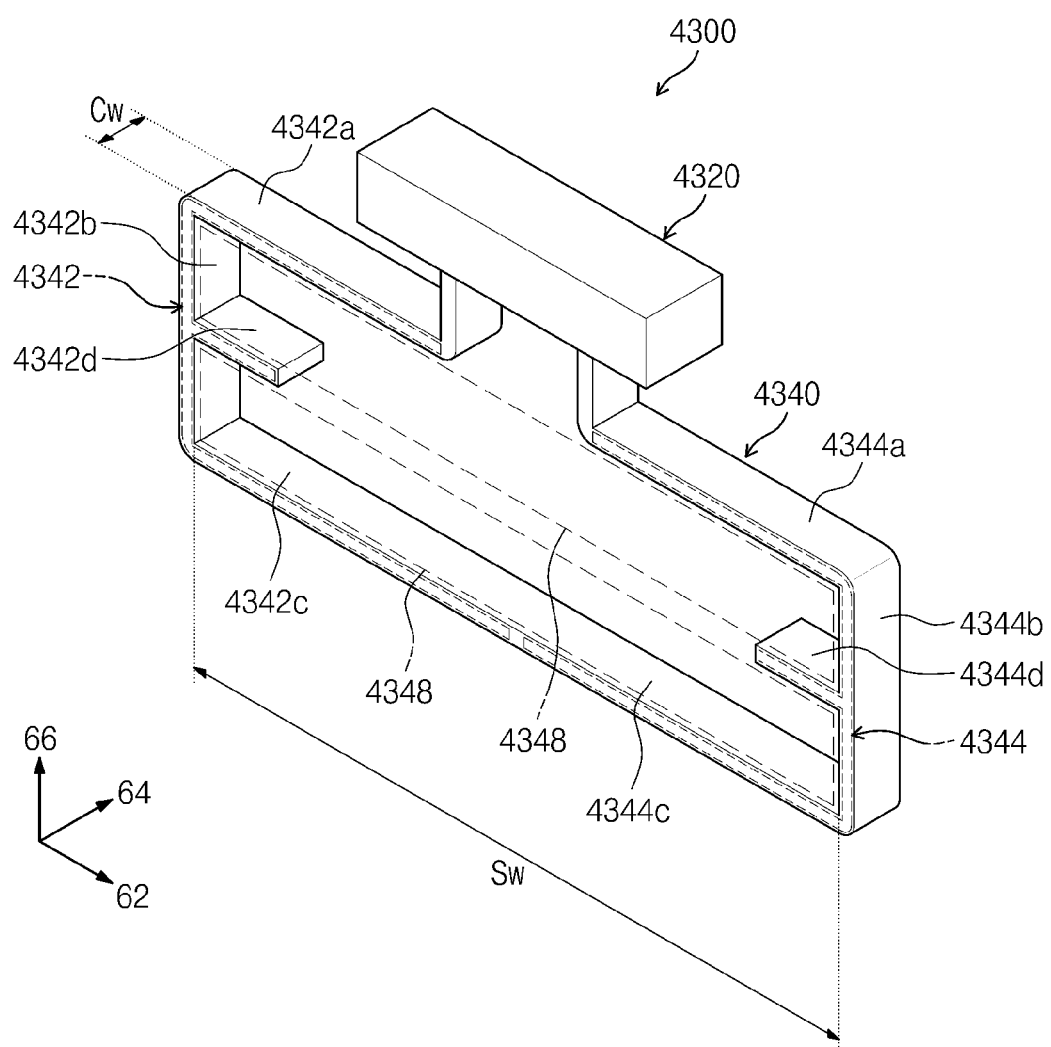
FIG. 17A is a perspective view illustrating another example of the heating member of FIG. 5.

FIG. 17A is a perspective view illustrating another example of the heating member. In accordance with example embodiments of inventive concepts, a heating member 4300 may include a power supply 4320 and a coil 4340. The coil 4340 may be electrically connected to the power supply 4320 to receive an alternating current from the power supply 4320. Internal spaces 4348 through which the printed circuit board 10 may pass may be provided to the inside of the coil 4340. The coil 4340 may include a first line portion 4342 and a second line portion 4344. The first and second line portions 4342 and 4344 may have the same shape. The second line portion 4344 may continuously extend from an edge of the first line portion 4342. The first line portion 4342 and the second line portion 4344 may have respective top portions 4342a and 4344a, respective side portions 4342b and 4344b, and respective bottom portions 4342c and 4344c. The bottom portion 4342c of the first line portion 4342 may extend from the bottom portion 4344c of the second line portion 4344. The side portions 4342b and 4344b may be disposed in parallel to be separated from each other. The top portion 4342a may be disposed to be parallel to the bottom portion 4342c. The top and bottom portions 4342a and 4342c may be disposed to be perpendicular to the side portion 4342b. The top portion 4342a, the side portion 4342b, and the bottom portion 4342c may be combined with one another to form a '⊏' shape.

A guide portion 4342d supporting one edge of the printed circuit board 10 may be provided to the first line portion 4342. The guide portion 4342d may extend in a direction facing the second line portion 4344 from the side portion 4342b of the first line portion 4342. The guide portion 4342d may be disposed between the top portion 4342a and the bottom portion 4342c. Similarly, a guide portion 4344d extending in a direction facing the first line portion 4342 may be provided on the second line portion 4344. The guide portion 4344d may be disposed to be parallel to the bottom portion 4342c of the first line portion 4342. The guide portions 4342d and 4344d may be disposed to be spaced apart from each other. The guide portions 4342d and 4344d may associate with each other to support the printed circuit board 10. Also, the bottom portions 4342c and 4344c may associate with each other to support the printed circuit board 10. As depicted in FIG. 17A, one guide portion (4342d or 4344d) may be provided on the first line portion 4342 and the second line portion 4344 respectively.

Figure 17B:
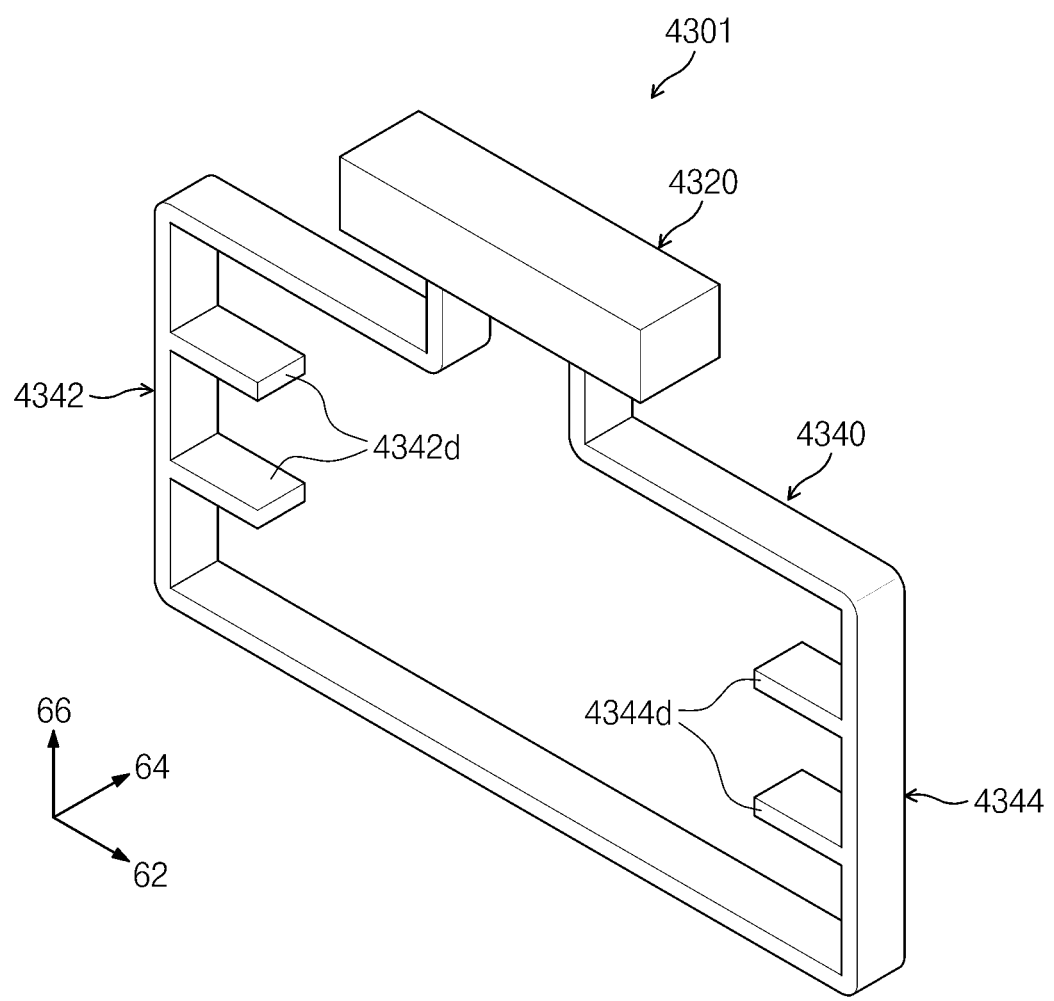
FIG. 17B is a perspective view illustrating a modified example of the heating member of FIG. 17A.

In example embodiments of inventive concepts, as depicted in FIG. 17B, a plurality of guide portions may be provided to the first and second line portions 4342 and 4344 respectively. When the guide portions are provided in plurality, the guide portions may be stacked and spaced a predetermined or preset distance apart from one another.

In the coil 4340 of FIG. 17A, a region surrounded by the top portions 4342a and 4344a, the guide portions 4342d and 4344d and a portion of the side portions 4342b and 4344b may be provided as one of the internal spaces 4348 of the coil 4340. Also, a region surrounded by the bottom portions 4342c and 4344c, the guide portions 4342d and 4344d and a portion of the side portions 4342b and 4344b may be provided as the other of the internal spaces 4348 of the coil 4340. In the FIG. 17B, a region surrounded by two pairs of guide portions 4342d and 4344d and a portion of two pairs of side portions 4342b and 4344b additionally disposed to be adjacent to the internal spaces 4348 described above may be provided as another internal space 4348. That is, the coils 4340 of FIG. 17A and FIG. 17B may include a plurality of internal spaces 4348 and the internal spaces 4348 may be separated by the guide portions 4342d and 4344d.

As an alternative, only the guide portions 4342*d* and 4344*d* may be used to support the printed circuit board 10 except the bottom portions 4342*c* and 4344*c*. In example embodiments of inventive concepts, the number of the internal spaces 4348 of the coil 4340 may be equal to the number of the guide portions 4342*d* provided to the first line portion 4342.

The top portions 4342*a* and 4344*a*, the side portions 4342*b* and 4344*b*, the bottom portions 4342*c* and 4344*c* and the guide portions 4342*d* and 4344*d* may have the same width (Cw) across the whole length thereof. The first and second line portions 4342 and 4344 may be symmetrically disposed with respect to a virtual plane crossing a space between the first and second line portions 4342 and 4344.

Figure 18:
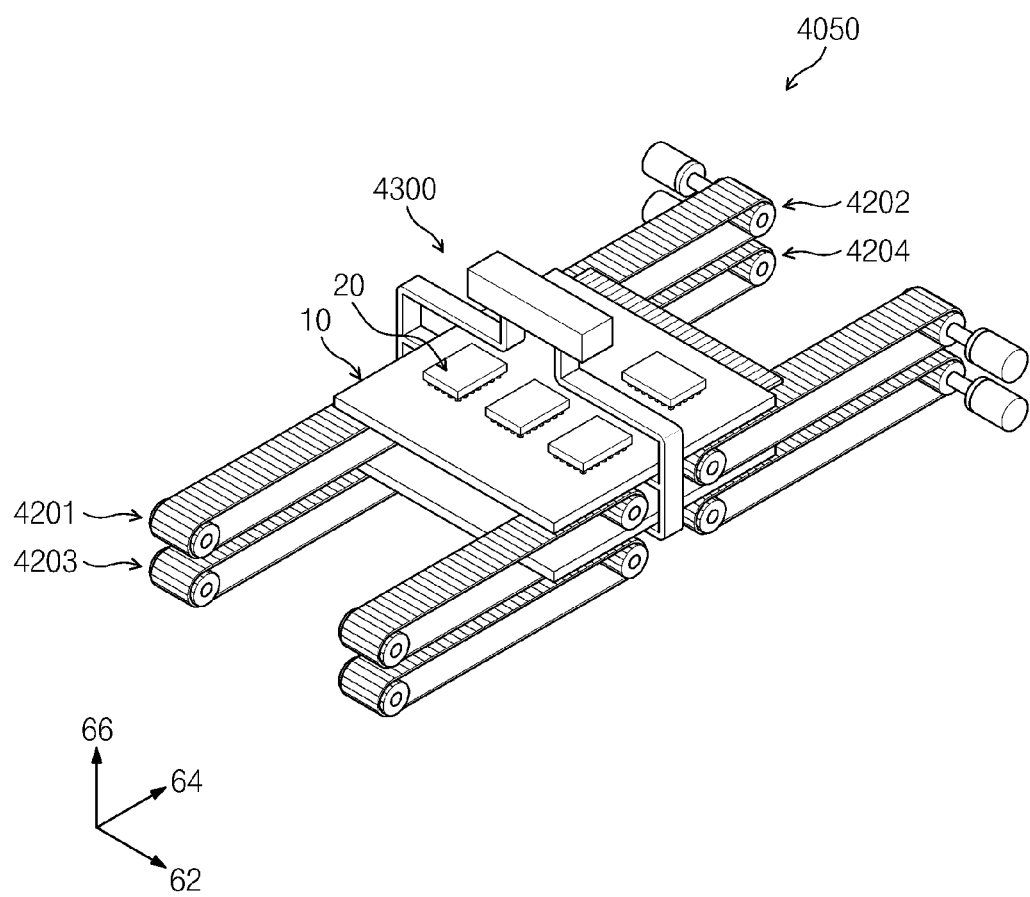

FIG. 18 is a perspective view illustrating a reflow process 4050 including the heating member 4300 of FIG. 17A. The number of input supporters 4201 and 4203 and the number of output supporters 4202 and 4204 may be equal to the number of the internal spaces 4348 provided in the coil 4340 respectively. The input supporters 4201 and 4203 may be disposed to be spaced a predetermined or preset distance along the third direction 66 apart from each other. The input supporters 4201 and 4203 and the output supporters 4202 and 4204 constitute a pair respectively and have the same height. The coil 4340 may be disposed between the input supporters 4201 and 4203 and the output supporters 4202 and 4204 so that the internal spaces 4348 are disposed along the third direction 66. One internal space 4348 of the coil 4340 may be disposed to face a pair of the input supporter and the output supporter (4201, 4202 or 4203, 4204). The internal space 4348 may have a width (Sw) longer than a first side of the printed circuit board 10. In example embodiments of inventive concepts, the first side of the printed circuit board 10 may be perpendicular to the second direction 64 in which the printed circuit board 10 moves.

An alternating current may be applied to the coil 4340 from the power supply 4320. The printed circuit board 10 on which the semiconductor chip 20 is mounted may be placed on the conveyers of the input supporter 4201 and 4203. As the conveyers of the input supporter 4201 and 4203 rotate, the printed circuit board 10 may linearly move along the second direction 64. The printed circuit board 10 may pass through the internal space 4348 of the coil 4340 corresponding to the printed circuit board 10 to move from the front of the coil 4340 to the rear of the coil 4340 and a reflow process of the solder balls 22 may be performed by an induced heating while the printed circuit board 10 moves.

As described above, the support member and the moving member may be provided as a conveyer assembly However, in example embodiments of inventive concepts, the support member and the moving member may be provided to have various structures. For example, the support member may be provided as a rail and the moving member may be provided as a pusher to push a printed circuit board placed on the rail along the second direction. When a plurality of internal spaces of a coil is provided along a third direction, a plurality of slots into which a printed circuit board is inserted may be provided to the rail along the third direction and the pusher may be constituted to concurrently push a plurality of printed circuit boards inserted into the slots.

Figure 19:
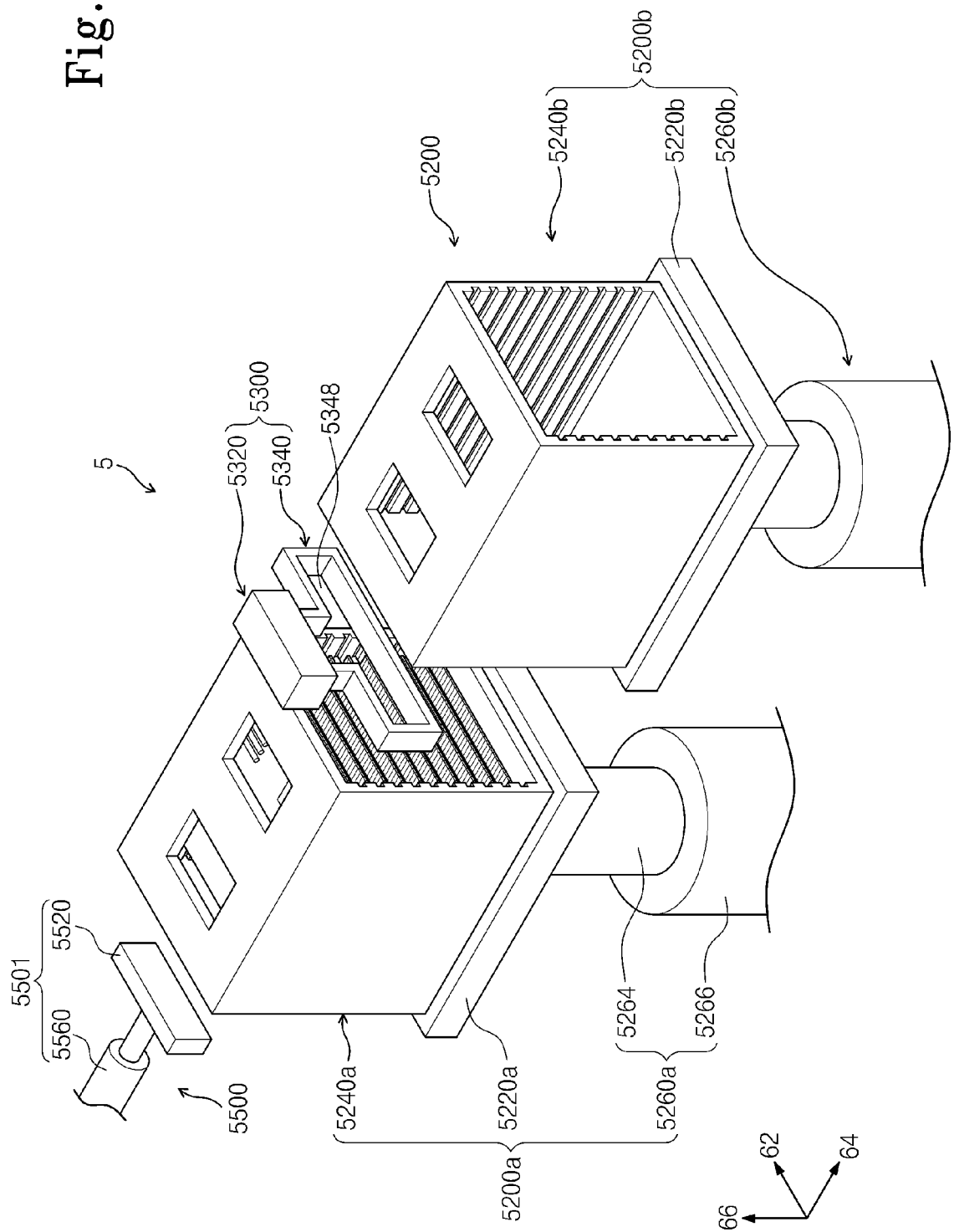

FIG. 19 is a perspective view illustrating an example of a package apparatus 5 in accordance with example embodiments of inventive concepts. The package apparatus 5 may include a support member 5200, a heating member 5300, and a moving member 5500. The heating member 5300 may include a coil 5340 connected to a power supply 5320. The power supply 5320 may, for example, generate AC power.

The support member 5200 may include an input supporter 5200*a* and an output supporter 5200*b*.

The input supporter 5200*a* and the output supporter 5200*b* may be sequentially disposed along the second direction 64. The input supporter 5200*a* may support the printed circuit board 10 before a reflow process is performed and the output supporter 5200*b* may support the printed circuit board 10 of which a reflow process is finished. The heating member 5300 may be disposed between the input supporter 5200*a* and the output supporter 5200*b*.

The heating member 5300 may have the similar structure to the heating member 300 of FIG. 5. As depicted in FIG. 19, the heating member 5300 may have a rectangular shape. An internal space 5348 of the heating member 5300 may have a height through which one or a plurality of printed circuit boards 10 can simultaneously pass.

An input supporter 5200*a* may include an input base 5220*a*, an input magazine 5240*a* and a base driver 5260*a*. The input magazine 5240*a* may be configured to receive a plurality of printed circuit boards 10. The input base 5220*a* may be a plate on which the input magazine 5240*a* is placed. The base driver 5260*a* may linearly move the input base 5220*a* along the third direction 66. An output supporter 5200*b* may include an output base 5220*b*, an output magazine 5240*b* and a base driver 5260*b*. The output base 5220*b*, the output magazine 5240*b* and the base driver 5260*b* may have the same structure as the input base 5220*a*, the input magazine 5240*a* and the base driver 5260*a*. The input supporter 5200*a* and the output supporter 5200*b* may be symmetrically disposed with respect to the heating member 5300.

Figure 20:
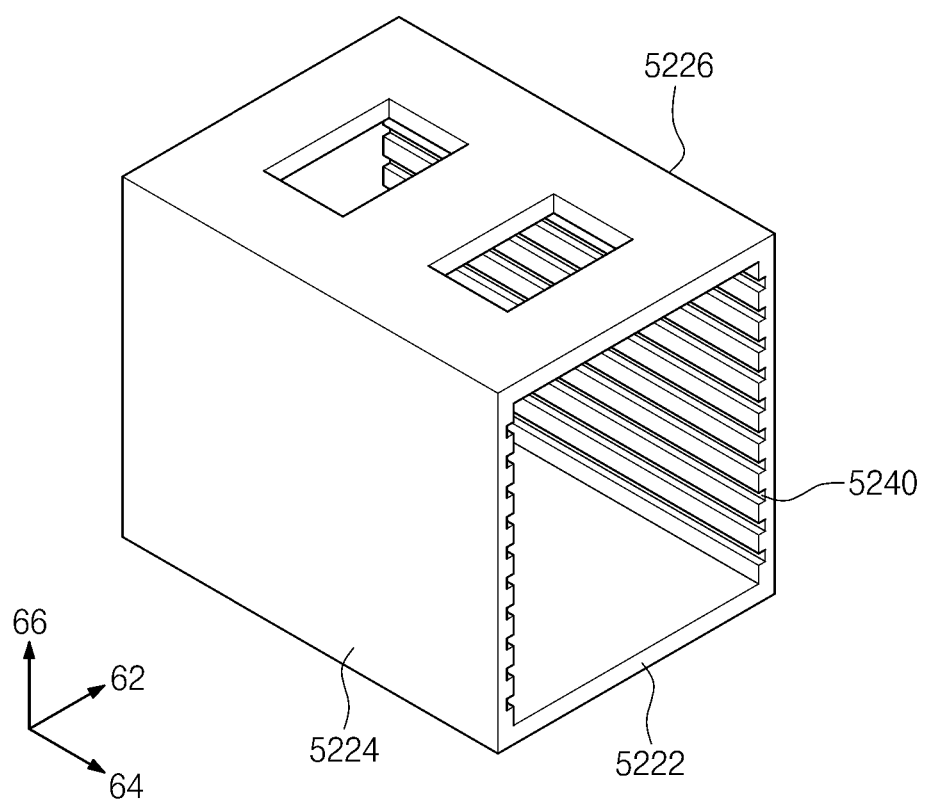

FIG. 20 is a perspective view illustrating an example of the input magazine 5240*a*. The input magazine 5240*a* may have a tub shape resembling a rectangular parallelepiped. The input magazine 5240*a* may include a bottom plate 5222, two side plates 5224, and a top plate 5226. The bottom plate 5222 and the top plate 5226 may be disposed to be spaced apart from each other (up and down) and to face each other. The two side plates 5224 may extend from both edges of bottom plate 5222 to both edges of top plates 5226. The side plates 5224 may have the same shape. The front and the rear of the input magazine 5240*a* may be open. The front and the rear of the input magazine 5240*a* may be provided as a path through which the printed circuit board 10 enters and leaves the input magazine 5240*a* and a space provided between the bottom plate 5222, the side plates 5224 and the top plate 5226 may receive the printed circuit board 10. Slots 5240 into which an edge region of the printed circuit board 10 may be inserted may be formed in an inside of each side plate 5224. The slot 5240 may extend from one end of the inside of the side plate 5224 to the other end of the inside of the side plate 5224. A plurality of slots 5240 may be spaced apart from one another up and down. The printed circuit boards 10 may be inserted into the slots 5240 through the front and the rear of the input magazine 5240*a* and may be received in the input magazine 5240*a* in a state that the printed circuit boards 10 are separately stacked.

Referring back to FIG. 19, the input base 5220*a* may have a top surface on which the input magazine 5240*a* is placed. The top surface may have a rectangular plate shape. The input base 5220*a* may be disposed to be separated from the heating member 5300. However, the input base 5220*a* and the output base 5220*b* may be disposed to be adjacent to the heating member 5300 so that the printed circuit board 10 in the input magazine 5240*a* stably moves to the slot 5240 in the output magazine 5240*b*. The input magazine 5240*a* and the output magazine 5240*b* may be placed on or removed from the input base 5220*a* and the output base 5220*b* by a worker or a separate moving means. The base driver 5260a may linearly move the input base 5220a along the third direction 66. The base driver 5260a may include a support rod 5264 extending in a down direction from a bottom surface of the input base 5220a and a motor 5266 connected to the support rod 5264. Whenever the printed circuit board 10 moves from the input magazine 5240a to the outside, the base driver 5260a lifts up or puts down the input base 5220a at regular intervals.

The moving member 5500 may move the printed circuit board 10 in the input magazine 5240a provided to the input supporter 5200a along the second direction 64. According to example embodiments of inventive concepts, the moving member 5500 may include a pusher 5501. The pusher 5501 may push the printed circuit board 10 in the input magazine 5240a, so that the printed circuit board 10 moves to the output magazine 5240b. The pusher 5501 may be disposed on the opposite side of the output supporter 5200b with respect to the input supporter 5200a. The pusher 5501 may include a pressure plate 5520 and a plate driver 5560. The pressure plate 5520 may have a rectangular plate shape. The plate driver 5560 may include a cylinder fixedly combined with the pressure plate 5520.

Figure 21:
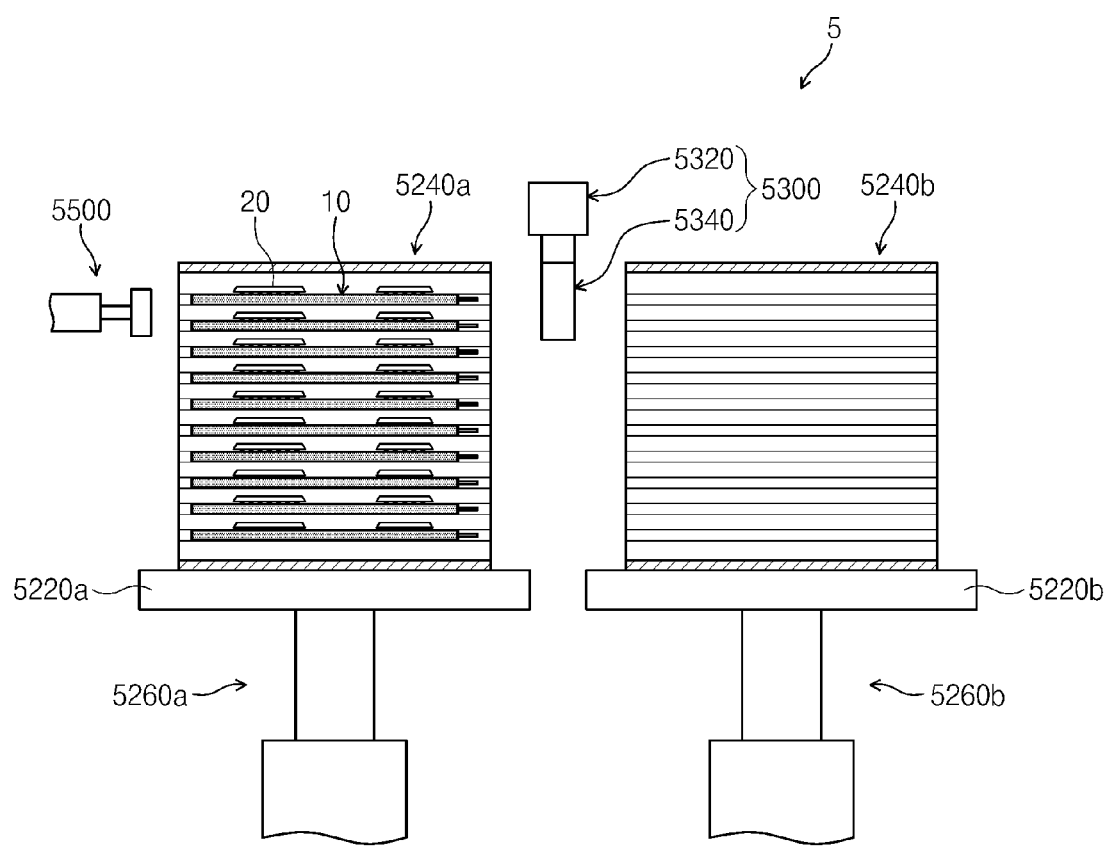
Figure 22:
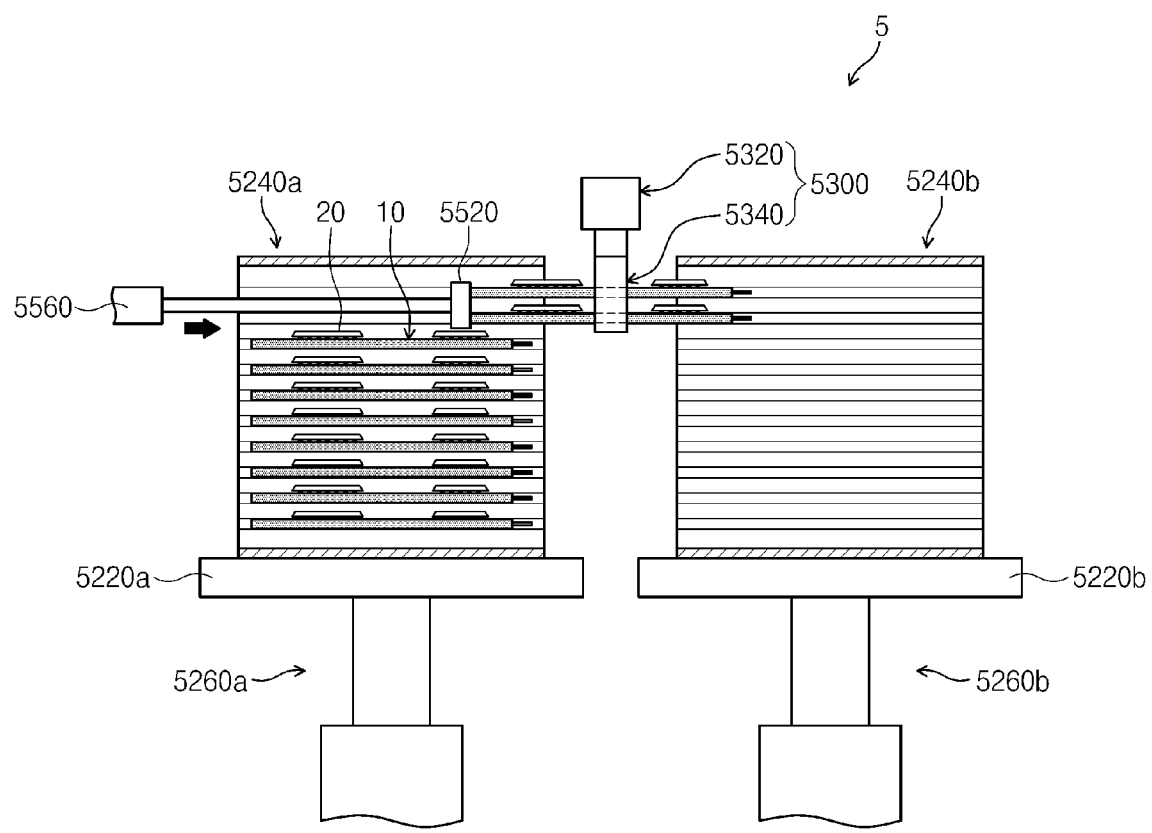
Figure 23:
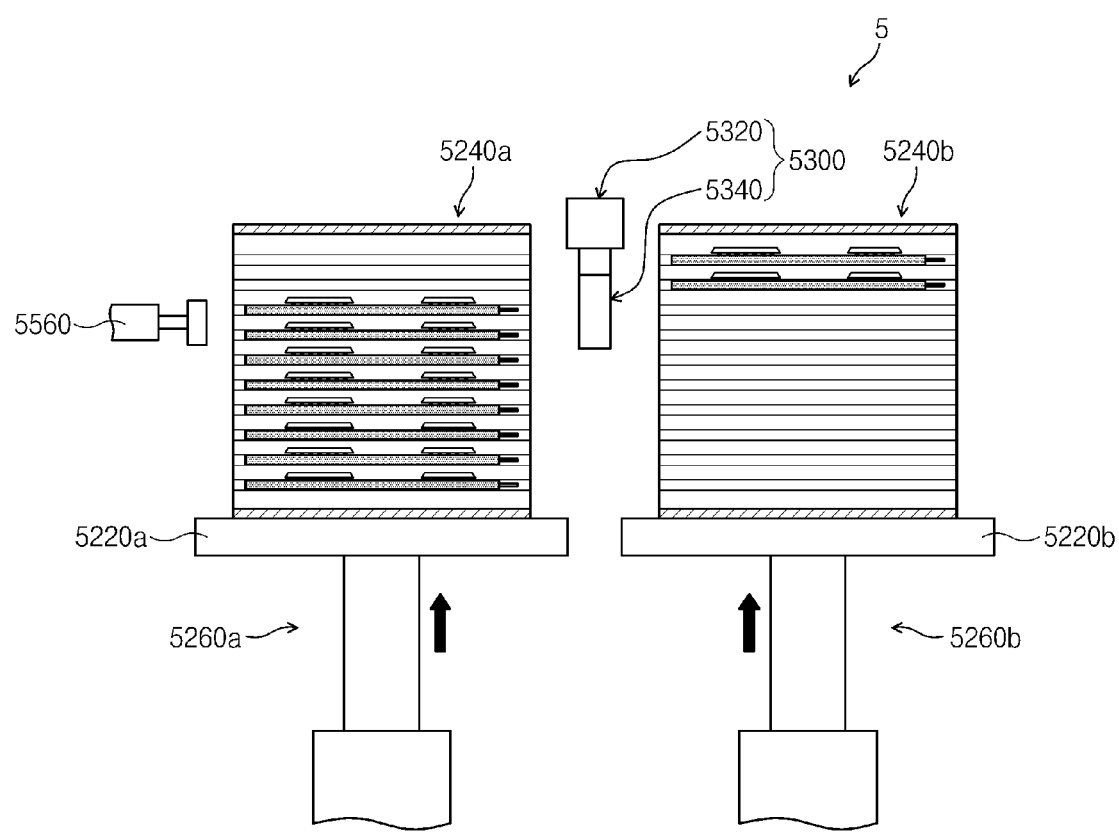

FIGS. 21 through 23 are views sequentially illustrating a method of performing a reflow process using the apparatus of FIG. 19. In FIGS. 21 through 23, a coil 5340 may include an internal space 5348 which may have a size large enough to concurrently pass two printed circuit boards 10. The input magazine 5240a in which the printed circuit board 10 may be received may be placed on the input base 5220a and the input base 5220a may be disposed so that two slots 5240 located at the uppermost portion of the input magazine 5240a have a height facing the internal space 5348 of the coil 5340. The output magazine 5240b having an empty inside may be placed on the output base 5220b and the output base 5220b may be disposed so that two slots 5240 located at the uppermost portion of the output magazine 5240b has a height facing the internal space 5348 of the coil 5340. The pusher 5501 may push the two printed circuit boards 10 until the two printed circuit boards 10 located at the uppermost portion of the input magazine 5240a pass through the internal space 5348 of the coil 5340 to be inserted into the slot 5240 located at the uppermost portion of the output magazine 5240b. A reflow process of the solder balls 22 may be performed while the printed circuit boards 10 pass through the internal space 5348 of the coil 5340. The input base 5220a and the output base 5220b may move by a predetermined or preset distance along the third direction 66. The above described processes of FIGS. 22 and 23 may be repeated.

Figure 24:
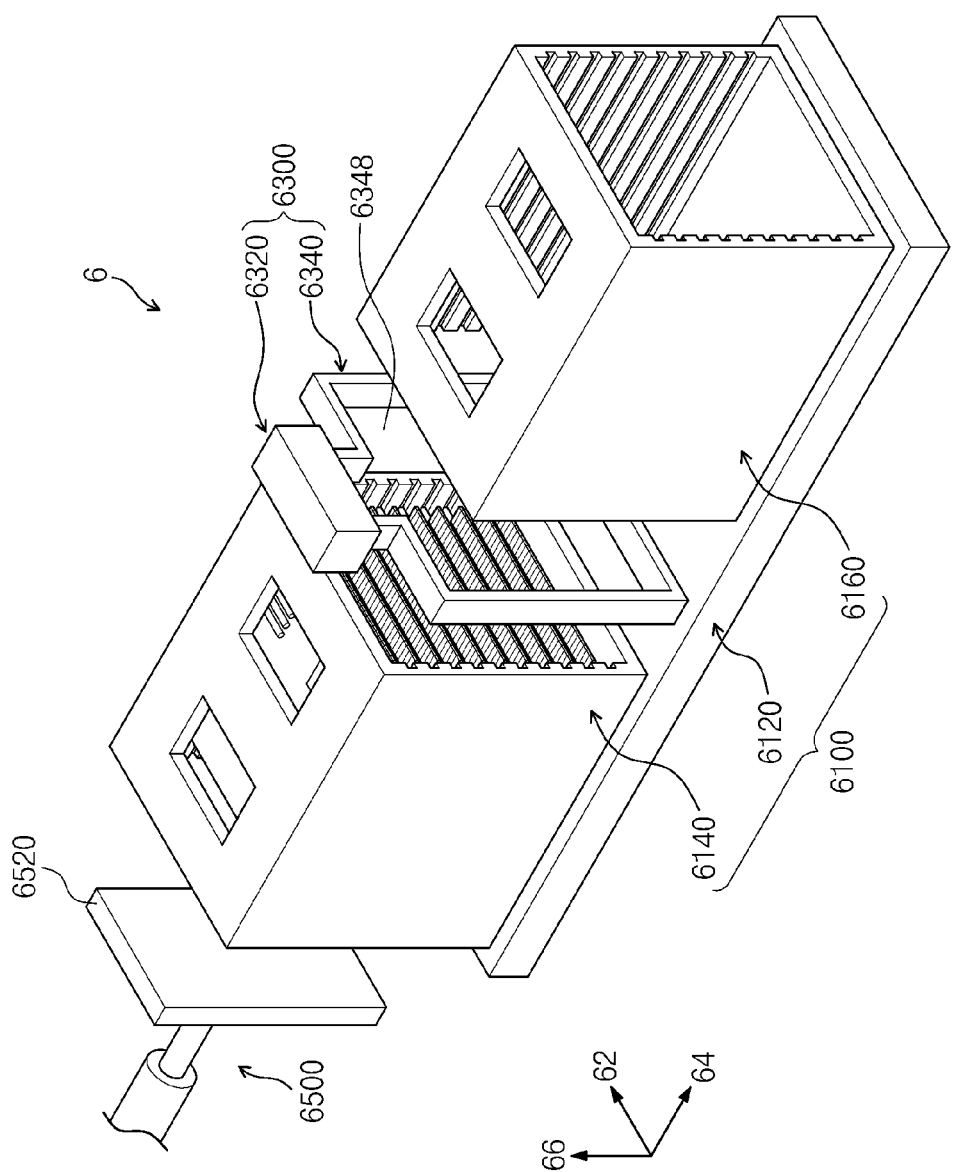

FIG. 24 is a perspective view illustrating an example of a package apparatus according to example embodiments of inventive concepts. A package apparatus 6 may include a support member 6100, a heating member 6300, and a moving member 6500. The heating member 6300 may include a power supply 6320 and a coil 6340. The power supply 6320 may be connected to the coil 6340 to deliver power, for example, AC power, to the coil 6340. The support member 6100, the heating member 6300 and the moving member 6500 may be provided into a housing (not shown). The housing may have a structure, a shape and material similar to the housing 100 of FIG. 3.

The support member 6100 may include a base 6120, an input magazine 6140 and an output magazine 6160. The input magazine 6140 may have the same structure as the input magazine of FIG. 20. The input magazine 6140 and the output magazine 6160 may have the same structure, shape and size. The base 6120 may have a top surface on which the input magazine 6140 and the output magazine 6160 are placed. The top surface of the base 6120 may have a rectangular plate shape. The heating member 6300 may be placed on upper portion of the base 6120 and the input magazine 6140 may be placed on one side of the heating member 6300 and the output magazine 6160 may be placed on the other side of the heating member 6300. The input magazine 6140, the base 6120 and the output magazine 6160 may be sequentially disposed along the second direction 64. The heating member 6300 may have a shape similar to the heating member 5300 of FIG. 19. The heating member 6300 may have an internal space 6348 which may have a size large enough to concurrently pass all the printed circuit boards 10 received in the input magazine 6140. Also, the moving member 6500 may have the same structure and shape as the moving member 5500 of FIG. 19. A pressure plate 6520 of the moving member 6500 has a size large enough to concurrently push all the printed circuit boards 10 received in the input magazine 6140.

Figure 25:
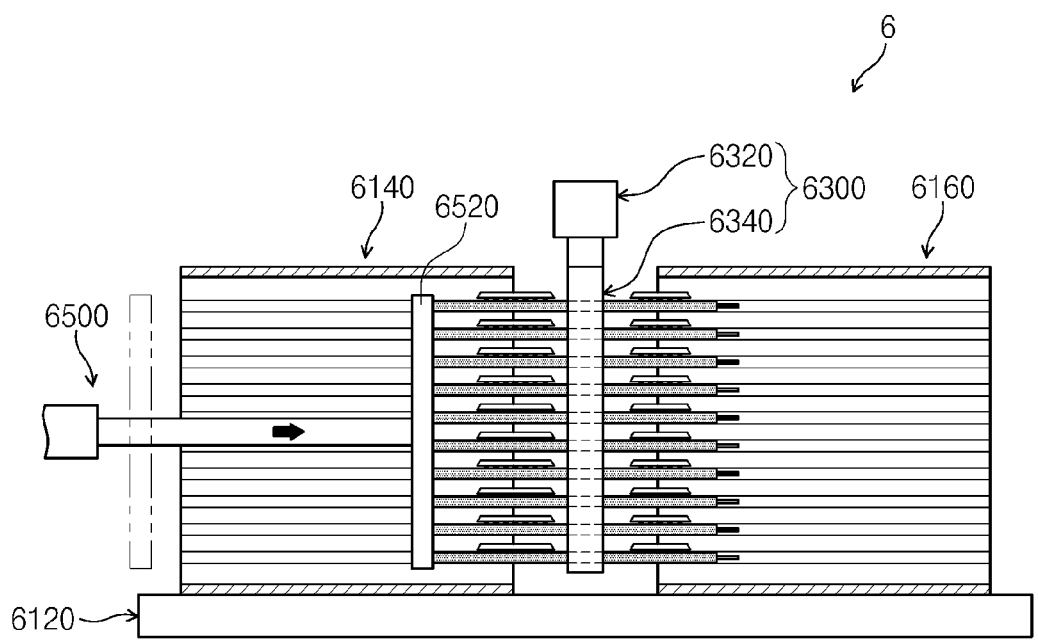

FIG. 25 is a view illustrating a method of performing a reflow process using the apparatus illustrated in FIG. 24. The input magazine 6140 in which the printed circuit boards 10 are received may be placed at the front of the heating member 6300 and the output magazine 6160 having an empty inside may be placed at a rear of the heating member 6300. The pressure plate 6520 may push the printed circuit boards 10 along the second direction 64 so that all the printed circuit boards 10 in the input magazine 6140 pass through the internal space 6348 of the heating member 6300 so that the printed circuit boards 10 may be inserted into the output magazine 6160. A reflow process of the solder balls 22 may be performed while the printed circuit boards 10 pass through the internal space 6348 of the coil 6340.

Figure 26:
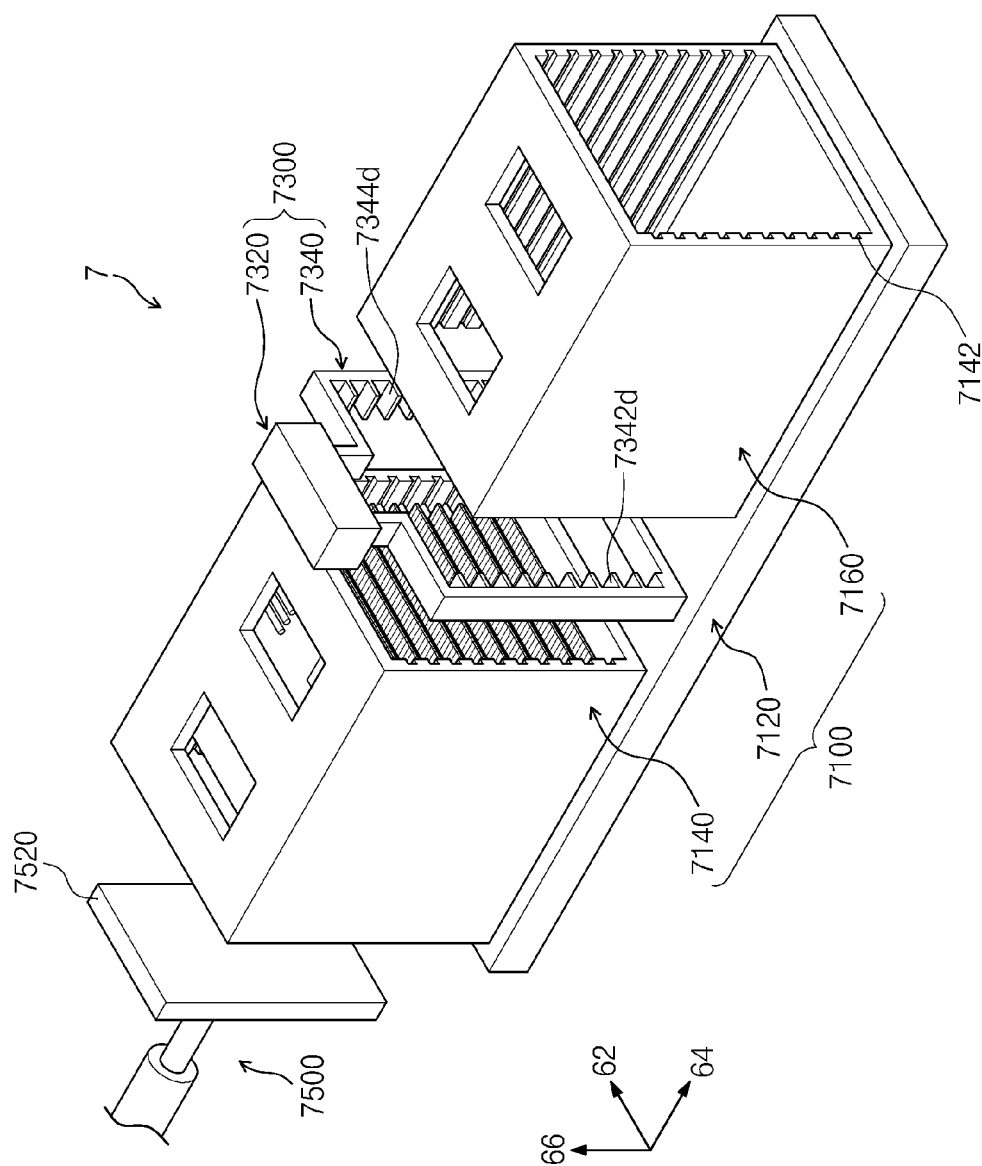

FIG. 26 is a perspective view illustrating a package apparatus in accordance with example embodiments of inventive concepts. A package apparatus 7 may include a support member 7100, a heating member 7300, and a moving member 7500. The support member 7100 and the moving member 7500 of FIG. 26 may have the same structure and shape as the support member 6100 and the moving member 6500 of FIG. 24. Accordingly, the support member 7100 may include an input magazine 7140, a base 7120, and an output magazine 7160 as shown in FIG. 26. Similarly, the moving member may include a pressure plate 7520 which may be configured to move at least one printed circuit board in the input magazine 7140 to the output magazine. The heating member 7300 may have a structure similar to the heating member 4301 of FIG. 17B. The heating member 7300 may include a coil 7340 and a power source 7320 connected to the coil. The coil 7340 may have guide portions 7342d and 7344d of the number of which may be equal to the number of slots 7142 provided to the input magazine 7140 and the output magazine 7160. Each guide portion may be disposed to have a height corresponding to each slot 7142.

Figure 27:
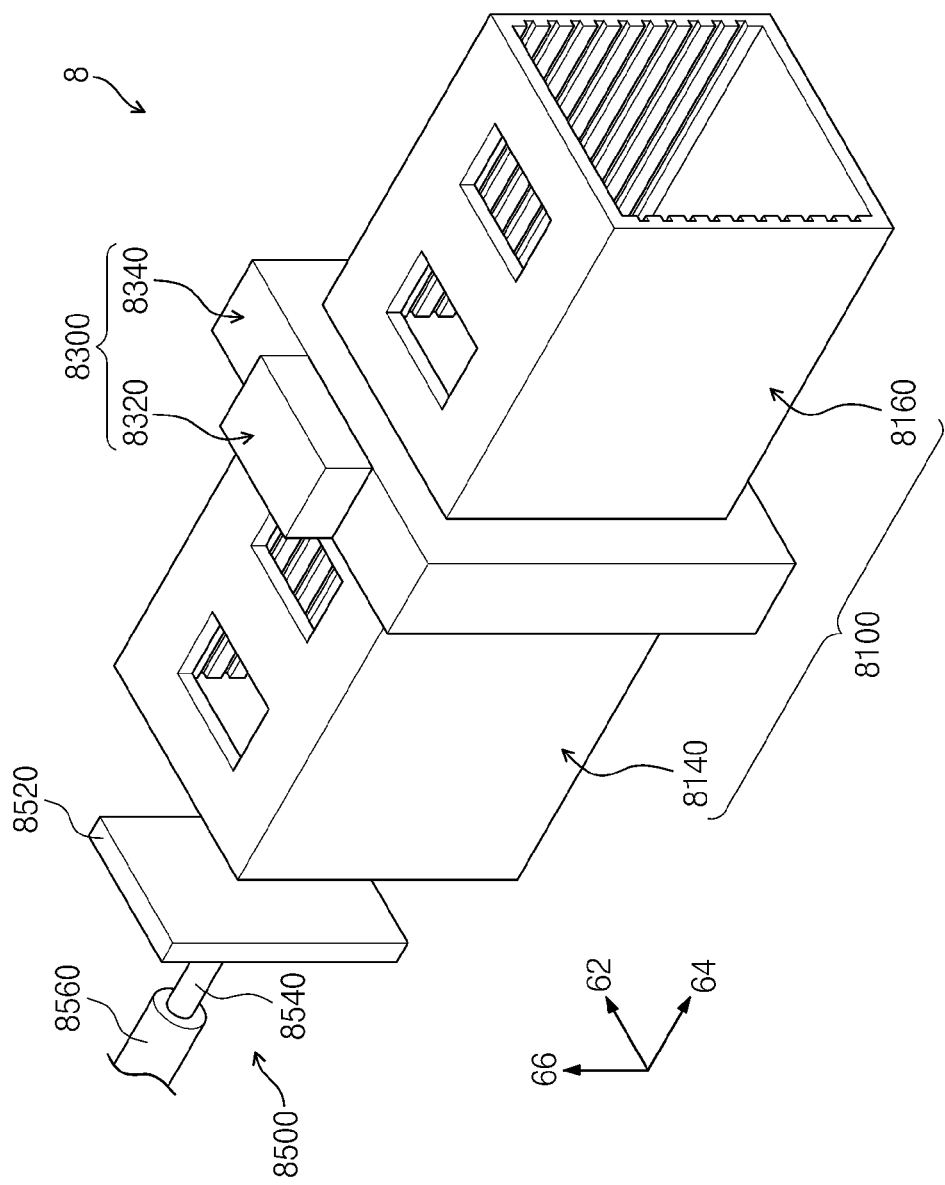

FIG. 27 is a perspective view illustrating an example of a package apparatus in accordance with example embodiments of inventive concepts. A package apparatus 8 may include a support member 8100, a heating member 8300, and a moving member 8500. The heating member 8300 and the moving member 8500 may have the same structure and shape as the heating member 7300 and the moving member 7500 of FIG. 26. Accordingly, the heating member 8300 illustrated in FIG. 27 may include a coil 8340 connected to a power source 8320. The power source 8320, for example, may supply AC power to the coil 8340. The support member 8100 may include an input magazine 8140 and an output magazine 8160. The input and output magazines 8140 and 8160 may be configured to receive printed circuit boards. The input magazine 8140 and the output magazine 8160 may have the same structure as the input magazine 7140 and the output magazine 7160 of FIG. 26. The input magazine 8140 may be fixedly installed on the heating member 8300 at the front of the heating member 8300 and the output magazine 8160 may be fixedly installed on the heating member 8300 at the rear of the heating member 8300. The moving member 8500 may include a pressure plate 8520 that may be configured to move at least one of the printed circuit boards that may be stored in the input magazine 8140. The moving member 8500 may also include a plate driver 8560 and an extending member 8540, for example, a cylinder, for moving the pressure plate 8520 against the printed circuit boards.

While example embodiments of inventive concepts have been particularly shown and described with reference to example embodiments of inventive concepts thereof, it will be understood by those of ordinary skill in the art that various changes in form and details may be made therein without departing from the spirit and scope of the following claims.

What is claimed is:

1. A reflow method of a solder ball provided to a treatment object, the reflow method comprising:
    providing a coil;
    applying a current to the coil; and
    moving the treatment object through an internal space surrounded by the coil;
    wherein moving the treatment object includes concurrently moving a plurality of stacked treatment objects through the internal space surrounded by the coil.

2. The reflow method of claim 1, wherein applying the current to the coil heats the plurality of stacked treatment objects.

3. The reflow method of claim 1, wherein a support member supports the plurality of stacked treatment objects as the plurality of stacked treatment objects is moving through the internal space surrounded by the coil.

4. The reflow method of claim 3, wherein the support member is on one of a front and a rear of the coil.

5. The reflow method of claim 3, wherein the support member includes:
    a first magazine into which the plurality of stacked treatment objects is inserted and stacked, the first magazine being provided to a front of the coil; and
    a second magazine into which the plurality of stacked treatment objects is inserted and stacked, the second magazine being provided to a rear of the coil to face the first magazine.

6. A reflow method of a solder ball provided to a treatment object, the reflow method comprising:
    providing a coil;
    applying a current to the coil; and
    moving the treatment object through an internal space surrounded by the coil;
    wherein a support member supports the treatment object as the treatment object is moving through the internal space surrounded by the coil, and
    wherein the support member includes:
        an input supporter; and
        an output supporter.

7. The reflow method of claim 6, wherein the coil is between the input supporter and the output supporter.

8. The reflow method of claim 6, wherein a guide member on the coil supports the treatment object and guides movement of the treatment object in the internal space.

9. The reflow method of claim 6, wherein the internal space is a plurality of internal spaces each being separated from one another.

10. The reflow method of claim 9, wherein a plurality of guide members on the coil support a plurality of treatment objects and guide movement of the plurality of treatment objects in the plurality of internal spaces.

11. The reflow method of claim 10, wherein the plurality of internal spaces are separated from one another by the plurality of guide members.

12. The reflow method of claim 9, wherein a plurality of guide members on the coil support a plurality of treatment objects and guide linear movement of the plurality of treatment objects in the plurality of internal spaces.

13. The reflow method of claim 12, wherein the plurality of guide members are provided in parallel along a first direction.

14. The reflow method of claim 9, wherein the coil includes:
    at least three line portions parallel to one another; and
    connection portions, a number of which is less than a number of the at least three line portions by one, the connection portions connecting edges of the at least three line portions.

15. The reflow method of claim 9, wherein the plurality of internal spaces are stacked.

16. The reflow method of claim 9, wherein the plurality of internal spaces have a same height.

17. The reflow method of claim 6, wherein the support member further includes:
    a first magazine into which the treatment object is inserted and stacked, the first magazine being provided to a front of the coil; and
    a second magazine into which the treatment object is inserted and stacked, the second magazine being provided to a rear of the coil to face the first magazine.

18. A reflow method of a solder ball provided to a treatment object, the reflow method comprising:
    providing a coil;
    applying a current to the coil; and
    moving the treatment object through an internal space surrounded by the coil;
    wherein the coil includes a first line portion and a second line portion, and
    wherein the first and second line portions have a same shape and are symmetrically arranged with respect to a virtual plane crossing a space between the first and second line portions.

19. The reflow method of claim 18, wherein the second line portion extends from an edge of the first line portion,
    wherein the first line portion includes at least one guide member extending toward the second line portion, and
    wherein the at least one guide member supports one edge of the treatment object.

20. The reflow method of claim 18, wherein the second line portion extends from an edge of the first line portion, and
    wherein the first line portion includes a plurality of enlarged portions opposed to a side facing the second line portion and a reduced portion between the enlarged portions.

* * * * *